(12) United States Patent
Honma

(10) Patent No.: US 9,988,717 B2
(45) Date of Patent: Jun. 5, 2018

(54) SUBSTRATE PROCESSING APPARATUS

(71) Applicant: TOKYO ELECTRON LIMITED, Tokyo (JP)

(72) Inventor: Manabu Honma, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 346 days.

(21) Appl. No.: 14/997,684

(22) Filed: Jan. 18, 2016

(65) Prior Publication Data

US 2016/0215395 A1    Jul. 28, 2016

(30) Foreign Application Priority Data

Jan. 26, 2015   (JP) ................................. 2015-012654

(51) Int. Cl.
*C23C 16/455*    (2006.01)

(52) U.S. Cl.
CPC .. *C23C 16/45563* (2013.01); *C23C 16/45548* (2013.01)

(58) Field of Classification Search
USPC ........................................ 118/715; 156/345.1
See application file for complete search history.

(56) References Cited

U.S. PATENT DOCUMENTS

| | | | | |
|---|---|---|---|---|
| 5,522,934 A * | 6/1996 | Suzuki | ................... | C23C 16/455 118/723 AN |
| 6,328,221 B1 * | 12/2001 | Moore | ............... | C23C 16/45563 118/715 |
| 6,347,749 B1 * | 2/2002 | Moore | ............... | C23C 16/45563 118/715 |
| 6,474,562 B2 * | 11/2002 | Imanaka | ........... | C23C 16/45563 239/1 |
| 8,281,741 B2 * | 10/2012 | Chang | ................... | C23C 16/345 118/715 |
| 9,297,072 B2 * | 3/2016 | Kato | ..................... | C23C 16/402 |
| 2008/0115728 A1 * | 5/2008 | Matsuda | ........... | H01J 37/32009 118/723 R |
| 2013/0156940 A1 * | 6/2013 | Wu | ......................... | C23C 16/52 427/9 |
| 2016/0215395 A1 * | 7/2016 | Honma | ............. | C23C 16/45563 |
| 2017/0114461 A1 * | 4/2017 | Takahashi | ......... | C23C 16/45544 |
| 2017/0130333 A1 * | 5/2017 | Miura | ............... | C23C 16/45544 |

FOREIGN PATENT DOCUMENTS

JP    2010-135510 A    6/2010

* cited by examiner

*Primary Examiner* — Rudy Zervigon
(74) *Attorney, Agent, or Firm* — Nath, Goldberg & Meyer; Jerald L. Meyer

(57) ABSTRACT

There is provided a substrate processing apparatus which supplies a processing gas onto a surface of a substrate on a substrate mounting table from a gas nozzle. The apparatus includes: a ring member installed in a leading end side of to the gas nozzle rather than a through-hole and including an inner peripheral surface on which the gas nozzle inserted into the through-hole is mounted, at least one of contours of an outer peripheral surface and the inner peripheral surface being set to a spiral curve or a polygon obtained by linearly approximating the curve; and a pedestal part on which the ring member is mounted at left and right positions spaced apart from each other in a circumference direction of the ring member. A height of a position at which the gas nozzle is supported by the ring member is adjusted with a rotation of the ring member.

7 Claims, 20 Drawing Sheets

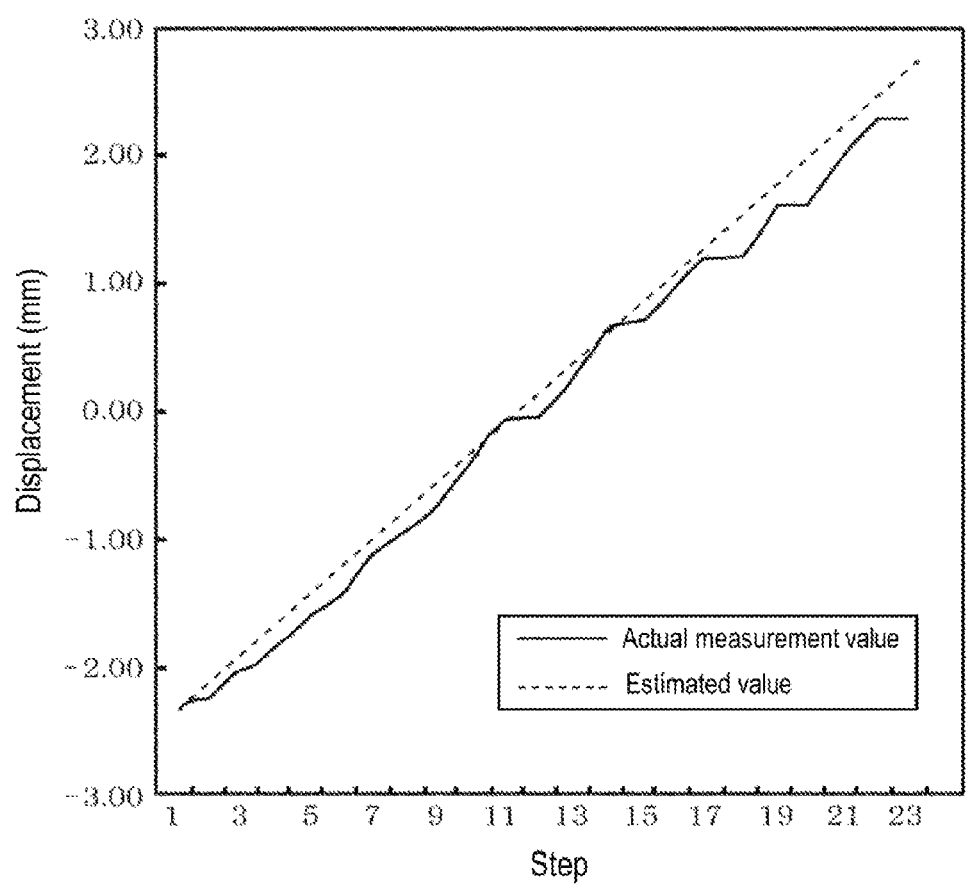

SUBSTRATE PROCESSING APPARATUS

CROSS-REFERENCE TO RELATED APPLICATION

This application claims the benefit of Japanese Patent Application No. 2015-012654, filed on Jan. 26, 2015, in the Japan Patent Office, the disclosure of which is incorporated herein in its entirety by reference.

TECHNICAL FIELD

The present disclosure relates to a substrate processing apparatus which supplies a processing gas onto a surface of a substrate from a gas nozzle inside a processing container, thus performing a process.

BACKGROUND

There is known a film forming apparatus using the so-called ALD (Atomic Layer Deposition) method as a method of forming a thin film such as a silicon nitride film on a substrate (hereinafter, referred to as "wafer") such as a semiconductor wafer. The apparatus using such an ALD method has a configuration in which a plurality of wafers mounted on a rotary table in a vacuum container is rotated with the rotation of the rotary table such that the wafers pass sequentially through a region to which a raw material gas is supplied and a region to which a reaction gas reacting with the raw material gas is supplied. In this apparatus, the raw material gas is supplied from a gas nozzle which extends in a diameter direction of the rotary table and has gas discharge holes formed along a length direction thereof. The gas nozzle needs to be installed parallel to the wafer so as to adsorb the raw material gas with high in-plane uniformity and to increase in-plane uniformity of a film forming process.

As an inclination adjustment mechanism which adjusts an inclination of the gas nozzle in this kind of substrate processing apparatus, there is known a structure in which the inclination of the gas nozzle with respect to a horizontal axis is controlled by adjusting a height level of a support member for supporting the gas nozzle from below and fastening the support member to a sidewall of a vacuum container by an inclination adjustment screw. In the inclination adjustment mechanism, the gas nozzle is inserted into the support member where the gas nozzle is subjected to a minute height adjustment by inclination adjustment screws which are disposed at two positions in a right-left direction. This complicates the adjustment operation.

In addition, to increase precision of the height adjustment requires finely working a screw thread. To meet such a requirement, the support member and the inclination adjustment screw are constructed by metal, and surfaces thereof are coated with a corrosion-resistance film. However, it is likely that, when tightening the screw, the film is peeled off, thus generating unwanted particles. As such, a technique is required to easily regulate the height of the support position of the gas nozzle with a simple configuration.

SUMMARY

Some embodiments of the present disclosure provide a technique for easily adjusting an orientation of a gas nozzle in a vertical direction, in a substrate processing apparatus which supplies a processing gas onto a surface of a substrate mounted on a substrate mounting table from a gas nozzle that is inserted into a through-hole formed a sidewall of a processing container, thus performing a process.

According to one embodiment of the present disclosure, there is provided a substrate processing apparatus which supplies a processing gas onto a surface of a substrate mounted on a substrate mounting table from a gas nozzle, the gas nozzle being inserted into a through-hole formed in a sidewall of a processing container and configured to extend in an anteroposterior direction, and the substrate mounting table being movable relative to the gas nozzle, the apparatus including: a ring member installed in a leading end side of to the gas nozzle rather than the through-hole and including an inner peripheral surface on which the gas nozzle inserted into the through-hole is mounted, wherein at least one of contours of an outer peripheral surface and the inner peripheral surface is set to a spiral curve or a polygon obtained by linearly approximating the spiral curve; and a pedestal part on which the ring member is mounted at left and right positions which are spaced apart from each other in a circumference direction of the ring member, wherein a height of a position at which the gas nozzle is supported by the ring member is adjusted with a rotation of the ring member.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 21 is a characteristic view showing the result of an evaluation test.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
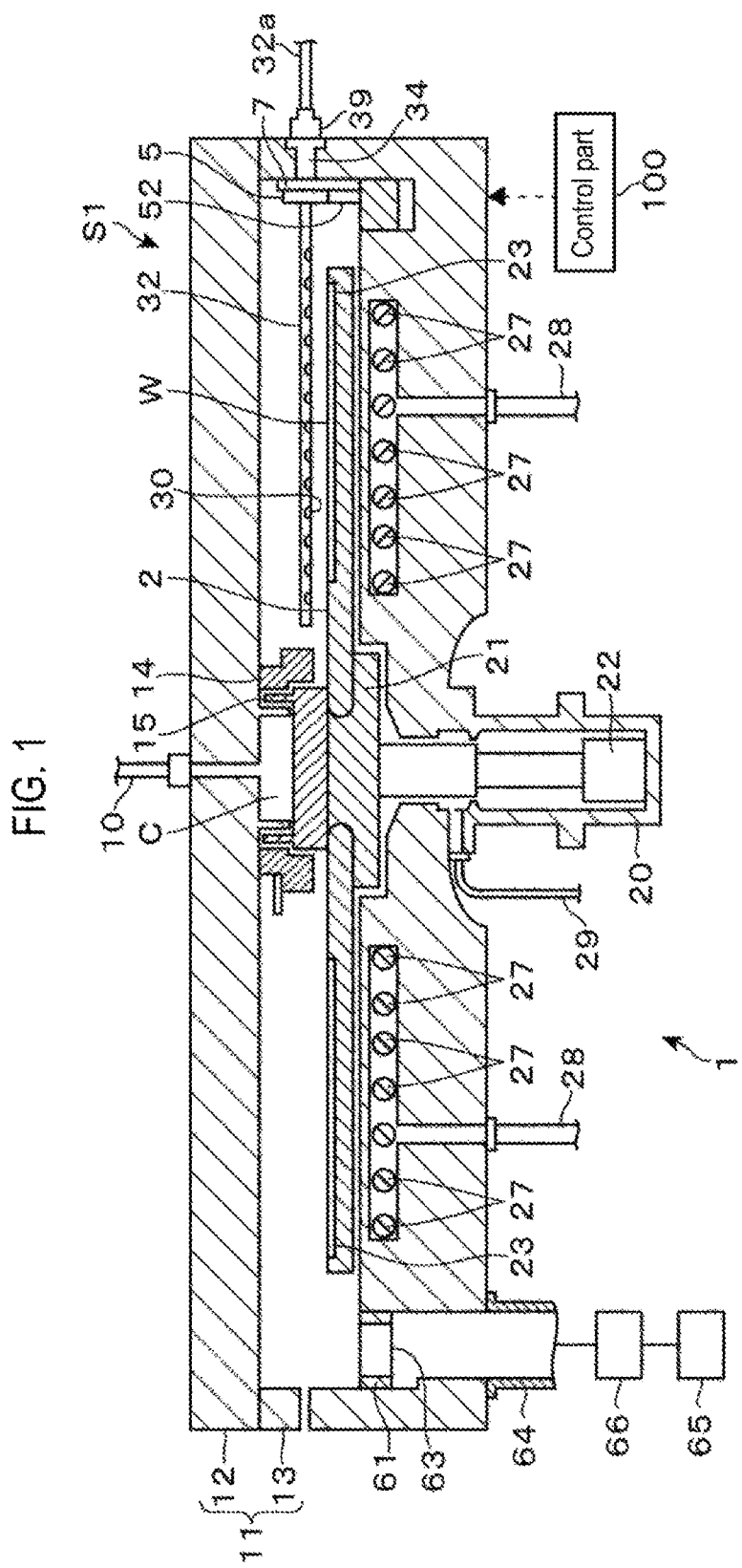
FIG. 1 is a longitudinal sectional view of a film forming apparatus as a substrate processing apparatus according to a first embodiment of the present disclosure.
Figure 2:
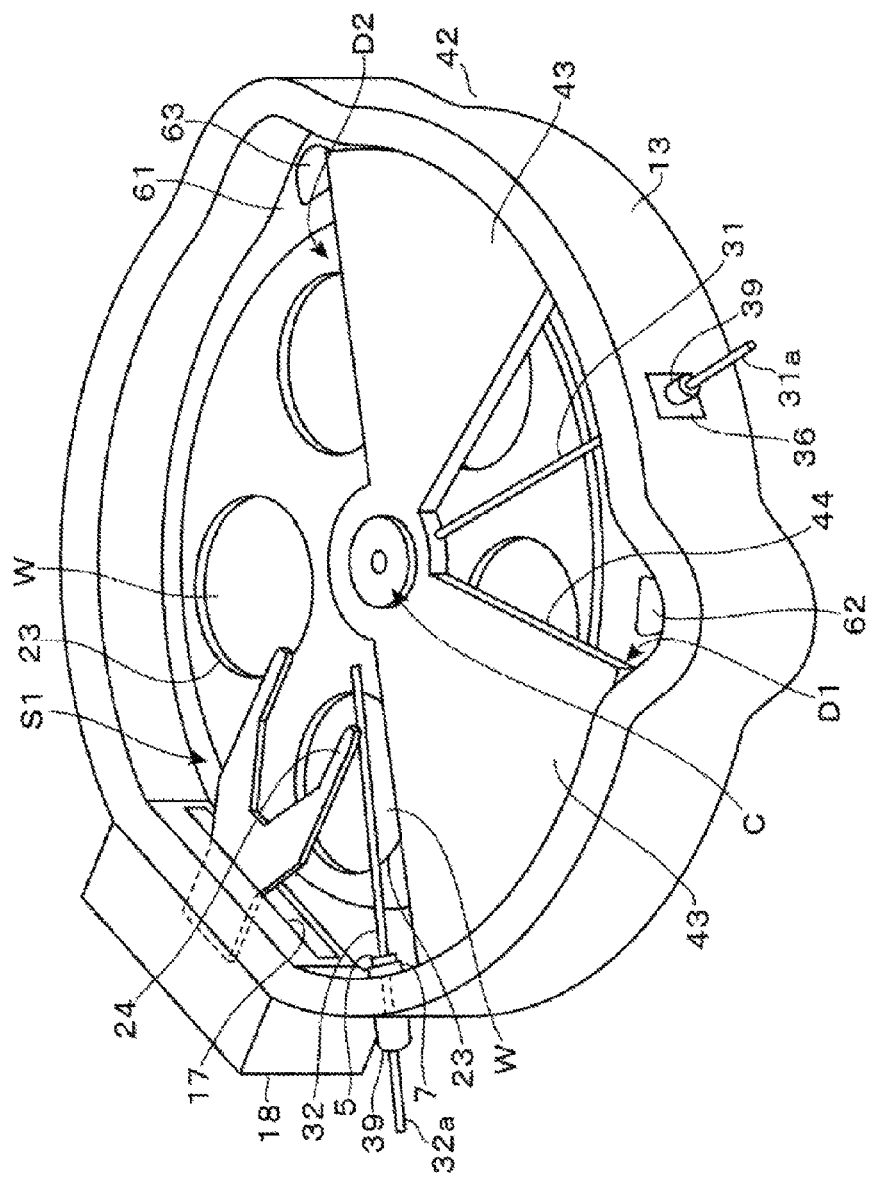
FIG. 2 is a schematic transverse perspective view of the film forming apparatus.
Figure 3:
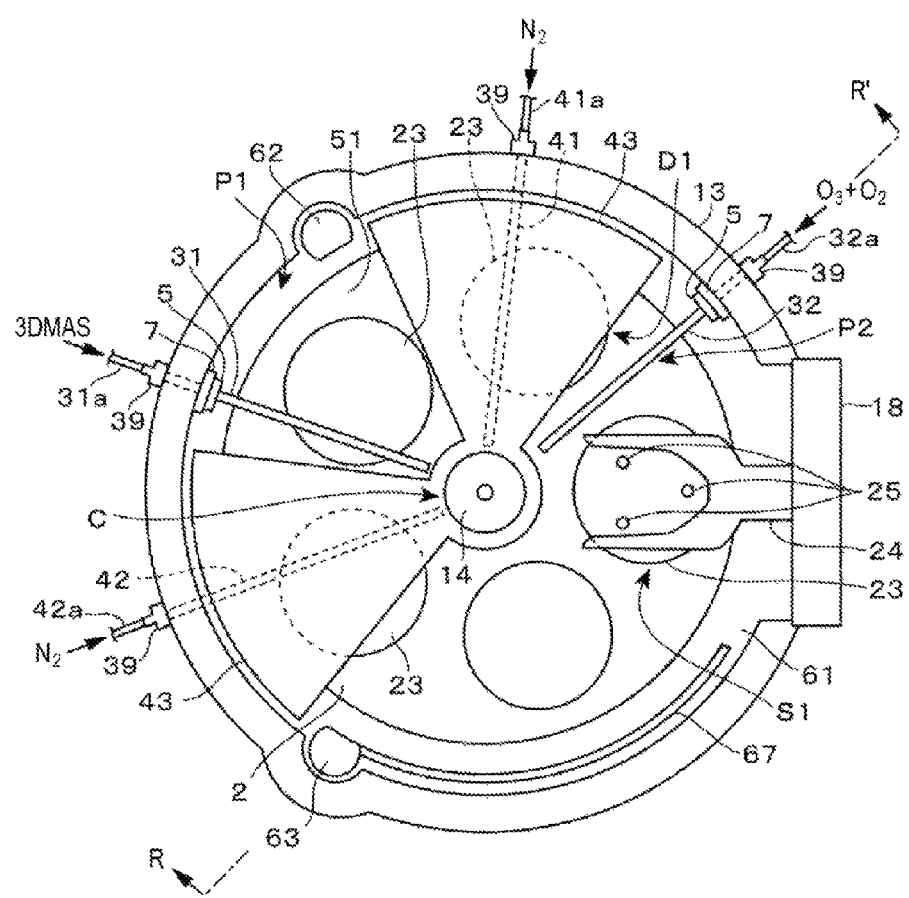
FIG. 3 is a transverse plan view of the film forming apparatus.

A film forming apparatus 1 as a substrate processing apparatus according to a first embodiment of the present disclosure will be described with reference to FIGS. 1 to 3. FIGS. 1 to 3 are a longitudinal sectional view, a schematic transverse perspective view, a transverse plan view of the film forming apparatus 1, respectively. FIG. 1 is the longitudinal sectional view taken along a line R-R' of FIG. 3. The film forming apparatus 1 sequentially supplies a raw material gas and a reaction gas reacting with the raw material gas onto a wafer W and forms a thin film of silicon nitride on the wafer W by the so-called ALD method.

A vacuum container 11 used as a processing container is formed in a substantially circular shape when viewed from the top. The vacuum container 11 includes a top plate 12 and a container main body 13 constituting a sidewall and bottom of the vacuum container 11. A convex portion 14 is installed in the central portion of the vacuum container 11. The convex portion 14 forms a central region C with a gas path 15 formed therein, together with a support part 21 configured to support a rotary table 2 in the central portion of the vacuum container 11. A reference numeral 10 in FIG. 1 represents a gas supply tube through which a nitrogen gas ($N_2$ gas) used as a separation gas is supplied to the gas path 15.

The rotary table 2 is formed in a circular shape when viewed from the top and is configured to rotate around its central axis by a rotating mechanism 22 installed below the support part 21. A plurality of (e.g., five) recess portions 23 used as substrate mounting regions is formed in a surface of the rotary table 2 along a rotational direction. The wafer W is mounted in the recess portion 23. A transfer port 17, which is opened and closed by a gate valve 18, is formed in the sidewall of the vacuum container 11. The wafer W is delivered to the recess portion 23 in a delivery region S1 by a combination of a transfer mechanism 24 and lifting pins (not shown). Reference numerals 25 in FIG. 3 represent holes for the lifting pins.

A heater 27 is installed below the rotary table 2. The rotary table 2 is heated by radiant heat of the heater 27 so that the wafer W mounted on the rotary table 2 is heated. Reference numerals 28 in FIG. 1 represents purge gas supply tubes through each of which the nitrogen gas is supplied into a space in which the heater 27 is disposed, thus purging the space. In addition, a purge gas supply part 29 configured to supply the nitrogen gas as a purge gas is installed in a case body 20 configured to cover the central portion of the bottom of the vacuum container 11.

Above regions through which the recess portions 23 of the rotary table 2 pass, four gas nozzles 31, 32, 41 and 42 are respectively arranged in a mutually spaced-apart relationship along a circumferential direction of the vacuum container 11. Each of the gas nozzles 31, 32, 41 and 42 is installed in the sidewall of the vacuum container 11 to horizontally extend from the sidewall of the vacuum container 11 toward the central region C. In this embodiment, the raw material gas nozzle 31, the separation gas nozzle 41, the reaction gas nozzle 32 and the separation gas nozzle 42 are disposed in that order in the clockwise direction. The term "horizontally" used herein encompasses "substantially horizontally" when viewed with human eyes. Such a definition is also applied to the following description.

The gas nozzles 31, 32, 41 and 42 are connected to respective gas supply sources (not shown) as follows. That is to say, the raw material gas nozzle 31 is connected to a supply source which supplies a silicon (Si)-containing raw material gas, e.g., 3DMAS (Tris (dimethylamino)silane: $SiH[N(CH_3)_2]_3$). The reaction gas nozzle 32 is connected to a supply source which supplies a reaction gas, e.g., a mixture gas of ozone ($O_3$) gas and oxygen ($O_2$) gas. Each of the separation gas nozzles 41 and 42 is connected to a supply source which supplies a nitrogen gas as a separation gas. An installation structure of each of the gas nozzles 31, 32, 41 and 42 will be described later.

A plurality of gas discharge holes 30 is formed in a lower surface side of each of the gas nozzles 31, 32, 41 and 42 along a length direction of each of the gas nozzles 31, 32, 41 and 42. A region below the raw material gas nozzle 31 is defined as a first processing region P1 in which the raw material gas is adsorbed onto the wafer W. A region below the reaction gas nozzle 32 is defined as a second processing region P2 in which the raw material adsorbed onto the wafer W is reacted with the reaction gas.

Two fan-like protrusion portions 43 which are formed to protrude downward from the top plate 12, are disposed below the top plate 12 of the vacuum container 11. For example, the separation gas nozzles 41 and 42 are respectively installed to be buried into the protrusion portions 43. Regions below lower surfaces 44 of the protrusion portions 43 are defined as separation regions D1 and D2 in which the mixing of the raw material gas and the reaction gas are prevented.

A ring-like member 61 is disposed below the vicinity of an outer peripheral portion of the rotary table 2 along an inner peripheral portion of the vacuum container 11. Exhaust ports 62 and 63 are formed in the ring-like member 61. The exhaust ports 62 and 63 are respectively coupled to a vacuum pump 65 used as a vacuum exhaust mechanism through an exhaust pipe 64 and a pressure adjustment part 66. A reference numeral 67 in FIG. 3 represents a groove formed in the ring-like member 61 to guide the exhaust of the gas.

Figure 4:
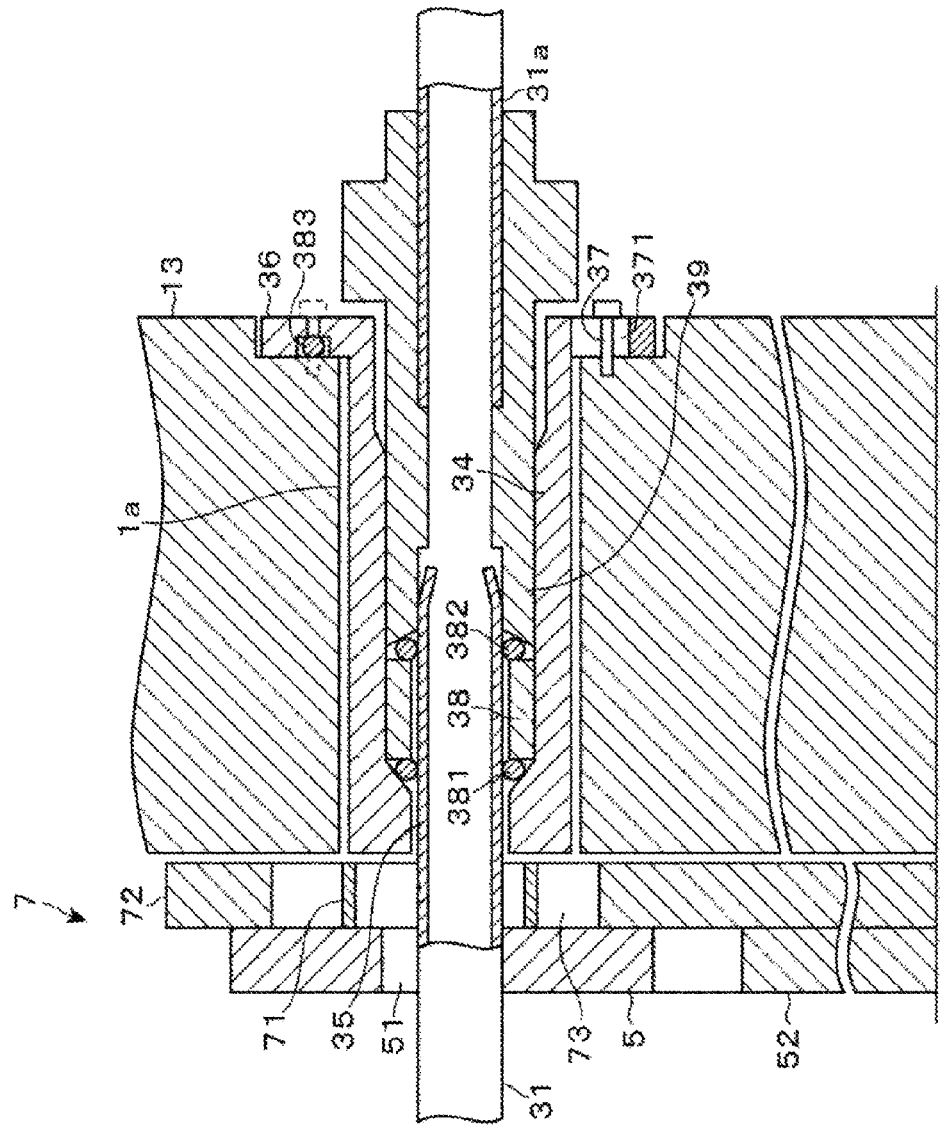
FIG. 4 is a longitudinal side view of a portion of the film forming apparatus.

Next, the installation structure of the gas nozzles 31, 32, 41 and 42 will be described with reference to FIGS. 4 to 8. The gas nozzles 31, 32, 41 and 42 have the same installation structure, and therefore, the raw material gas nozzle 31 will be described with an example. As shown in FIG. 4, a sleeve 34 is installed in a sidewall of the container main body 13 of the vacuum container 11 to install the raw material gas nozzle 31 from the outside. The sleeve 34 includes a flange 36. The flange 36 is fixed to an outer wall of the container main body 13 by position adjustment screws 37. On the other hand, an opening 1a is formed in the sidewall of the container main body 13 to install the sleeve 34 therein. For example, an inner diameter of the opening 1a is set to be slightly larger than an outer diameter of the sleeve 34. A hole portion 371 to which the position adjustment screw 37 is fastened is formed in a long hole shape such that an installation position of the sleeve 34 is roughly adjusted.

A portion 35 of the sleeve 34 opened toward the inside of the vacuum container 11 is configured such that one end of the raw material gas nozzle 31 is inserted into the portion 35 from the inside of the vacuum container 11. As will be described later, a base end side of the raw material gas nozzle 31 is supported from below inside the vacuum container 11 so that a height level of the support position is adjusted. To do this, the inner diameter of the portion 35 is set to be slightly larger than the outer diameter of the raw material gas nozzle 31 to the extent that the raw material gas nozzle 31 is displaced by a fine adjustment. The sleeve 34 forms a through-hole in the sidewall of the vacuum container 11. Assuming that the inner side of the vacuum container 11 referred to as a front side and the outer side of the vacuum container 11 referred to as a rear side, the raw material gas nozzle 31 is inserted into the through-hole of the sidewall of the vacuum container 11 and extends an anteroposterior direction.

A connection member 39 is inserted into the sleeve 34 through an inner sleeve 38 from the outside of the vacuum container 11. The connection member 39 is installed to connect a gas supply tube 31a configured to supply the raw material gas to the raw material gas nozzle 31, to the raw material gas nozzle 31. The gas supply tube 31a is inserted into one end side of the connection member 39. In addition, O-rings 381 and 382 used as sealing members are installed in front and back sides of the inner sleeve 38 of the sleeve 34. The base end side of the raw material gas nozzle 31 is inserted beyond the O-ring 382 inside the sleeve 34. The raw material gas nozzle 31 presses the O-rings 381 and 382 by its own weight so that the raw material gas nozzle 31 is fixed to the sleeve 34 while maintaining airtightness in the vacuum container 11. In addition, an O-ring 383 is disposed between the flange 36 and the sidewall of the vacuum container 11.

At the front side of the vacuum container 11, a ring member 5 made of ceramic is installed at a leading end side of the raw material gas nozzle 31 in the vicinity of the sleeve (through-hole) 34. The raw material gas nozzle 31 penetrates through an opening 51 defined by an inner peripheral surface of the ring member 5 and is mounted inside the opening 51. A contour of the opening 51 is a true circle or a regular polygon. In this embodiment, the opening 51 is formed in the true circle having a diameter larger than that of the raw material gas nozzle 31. As shown in a front view of FIG. 6 (when viewed from the leading end side of the raw material gas nozzle 31 toward the base end side), the center point O of the ring member 5 is in line with the center point of the contour of the opening 51. Since the raw material gas nozzle 31 is supported at a lower end of the true circle (the opening 51), the lower end is defined as a support position P of the raw material gas nozzle 31.

The contour of the outer peripheral surface of the ring member 5 is set to be, for example, a polygon obtained by linearly approximating a spiral curve. For example, the contour of the outer peripheral surface of the ring member 5 is configured such that a difference between a distance from one side to the center point O and a distance from other side adjacent to the one side to the center point O is constant with respect to any sides.

The ring member 5 with such a configuration is mounted on a pedestal part 52 made of, e.g., ceramic. The pedestal part 52 is formed in a plate-like body including a mounting portion 53 on which the ring member 5 is mounted. The pedestal part 52 is fixed on, e.g., the ring-like member 61 which constitutes a portion of the bottom of the vacuum container 11. The mounting portion 53 is formed in a V-formation having inclined surfaces 54 and 55 each of which is inclined from both end sides toward the central portion. The inclined surfaces 54 and 55 constituting the mounting portion 53 are formed in, e.g., a linear shape, and are formed symmetrically with a line 56 passing through a center position Q of the pedestal part 52 in a horizontal direction (X-direction).

Figure 6:
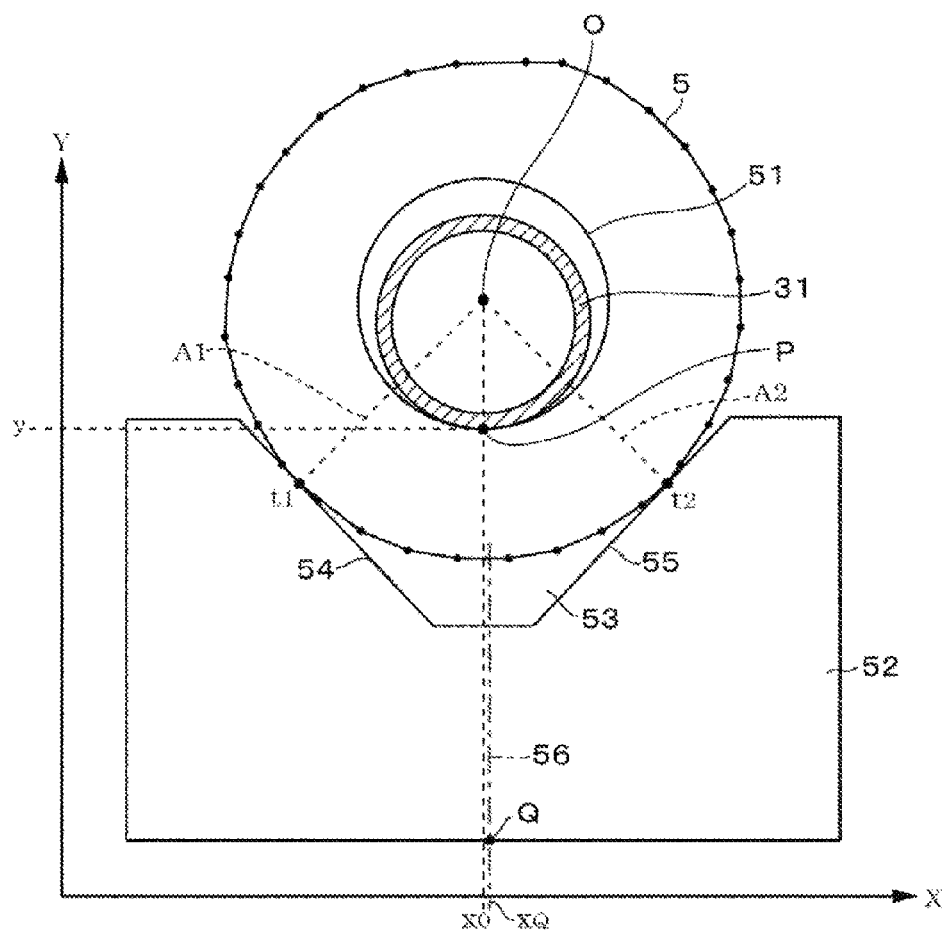
FIG. 6 is a front view showing the ring member and the pedestal part.

The outer peripheral surface of the ring member 5 is brought into contact with the inclined surfaces 54 and 55 in the mounting portion 53 of the pedestal part 52 so that the ring member 5 is mounted on the pedestal part 52 at a left position t1 and a right position t2 which are spaced apart from each other. Lines (radii) obtained by connecting the left position t1 and the right position t2 at which the ring member 5 is brought into contact with the inclined surfaces 54 and 55 with the center point O of the ring member 5 are referred to as A1 and A2, respectively. In this embodiment, the contour of the outer peripheral surface of the ring member 5 is formed such that a difference between the radii A1 and A2 becomes constant even if coordinates of the left position t1 and the right position t2 are changed with the rotation of the ring member 5. In addition, as shown in FIG. 6, the ring member 5 and the pedestal part 52 are arranged such that a position (X-coordinate: xO) of the center point O of the ring member 5 in the right-left direction is displaced from an X-coordinate xQ of the center position Q of the pedestal part 52 in the right-left direction, by a predetermined distance.

Figure 7:
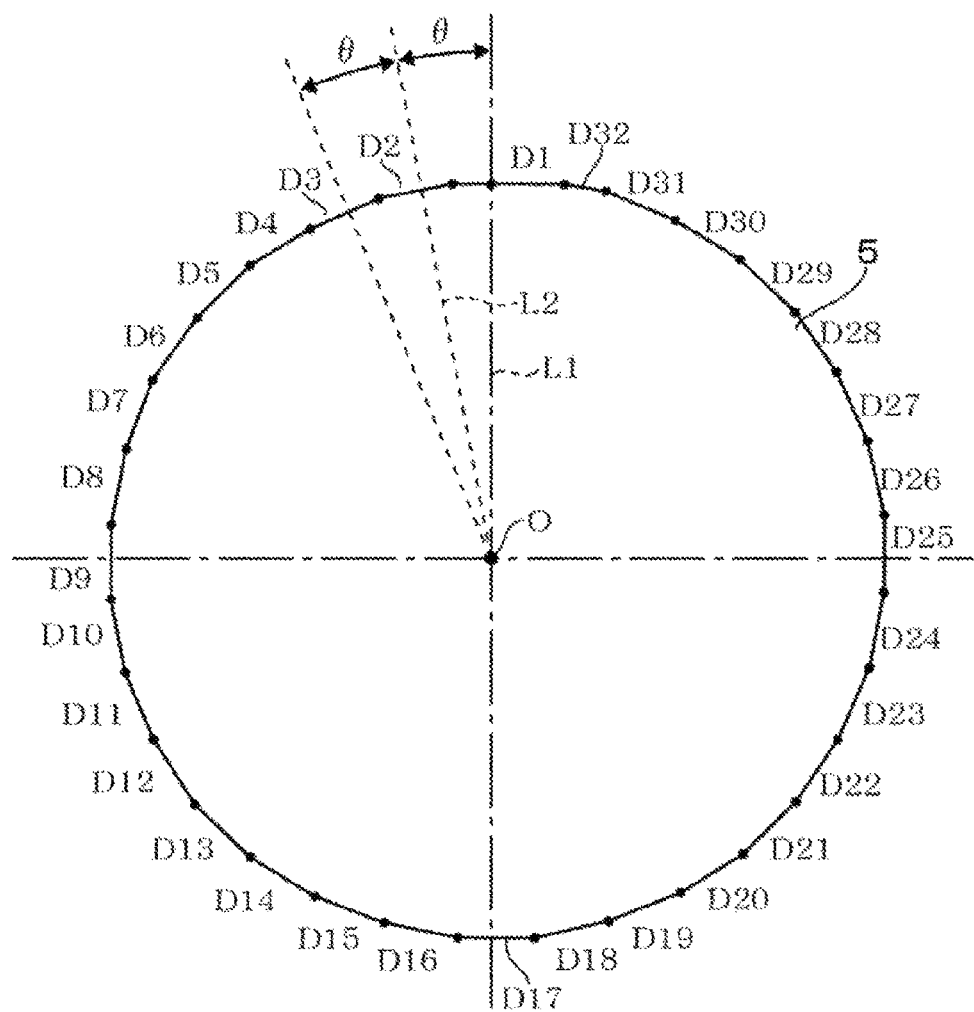
FIG. 7 is an explanatory view showing an example of a contour of the ring member.

An example of the contour of the outer peripheral surface of the ring member 5 will be described with reference to FIG. 7. In FIG. 7, only the contour of the ring member 5 and the center point O thereof are shown and the opening 51 is omitted. FIG. 7 shows a case where the contour of the outer peripheral surface is a 32-sided polygon obtained by linearly approximating a spiral curve. Such a polygon body is configured such that an angle θ between a straight line (e.g., L1) connecting one side (e.g., D1) with the center point O and a straight line (e.g., L2) connecting other side (e.g., D2) adjacent to the one side D1 with the center point O is constant (11.25 degrees) about any side. Also, for example, the polygon body is configured such that a difference between a distance from the one side (e.g., D1) to the center point O and a distance from the other side (e.g., D2) adjacent to the one side D1 to the center point O is constant (0.015 mm) about any side. In the ring member 5 configured as above, a difference between the radii A1 and A2 in the left position t1 and the right position t2 becomes constant even if positions, at which the outer peripheral surface of the ring member 5 is brought into contact with the inclined surfaces 54 and 55, are changed with the rotation of the ring member 5.

Figure 5:
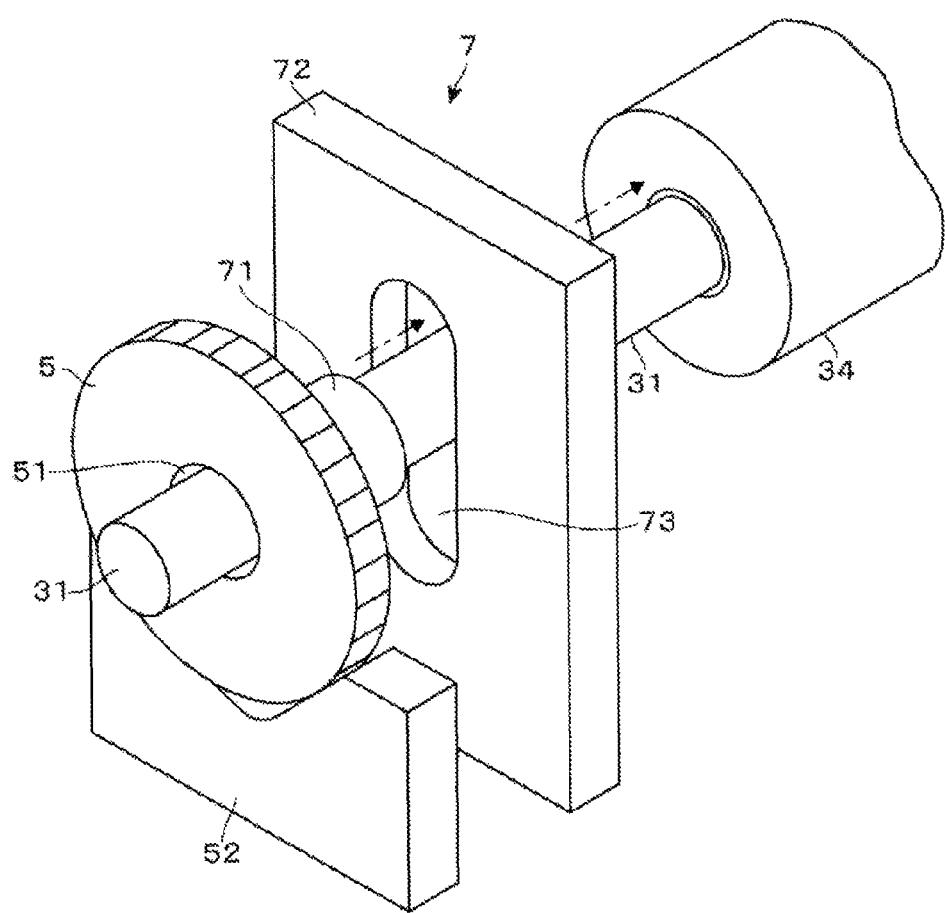
FIG. 5 is a schematic perspective view showing a ring member, a pedestal part and a regulating part, which are installed in the film forming apparatus.
Figure 8:
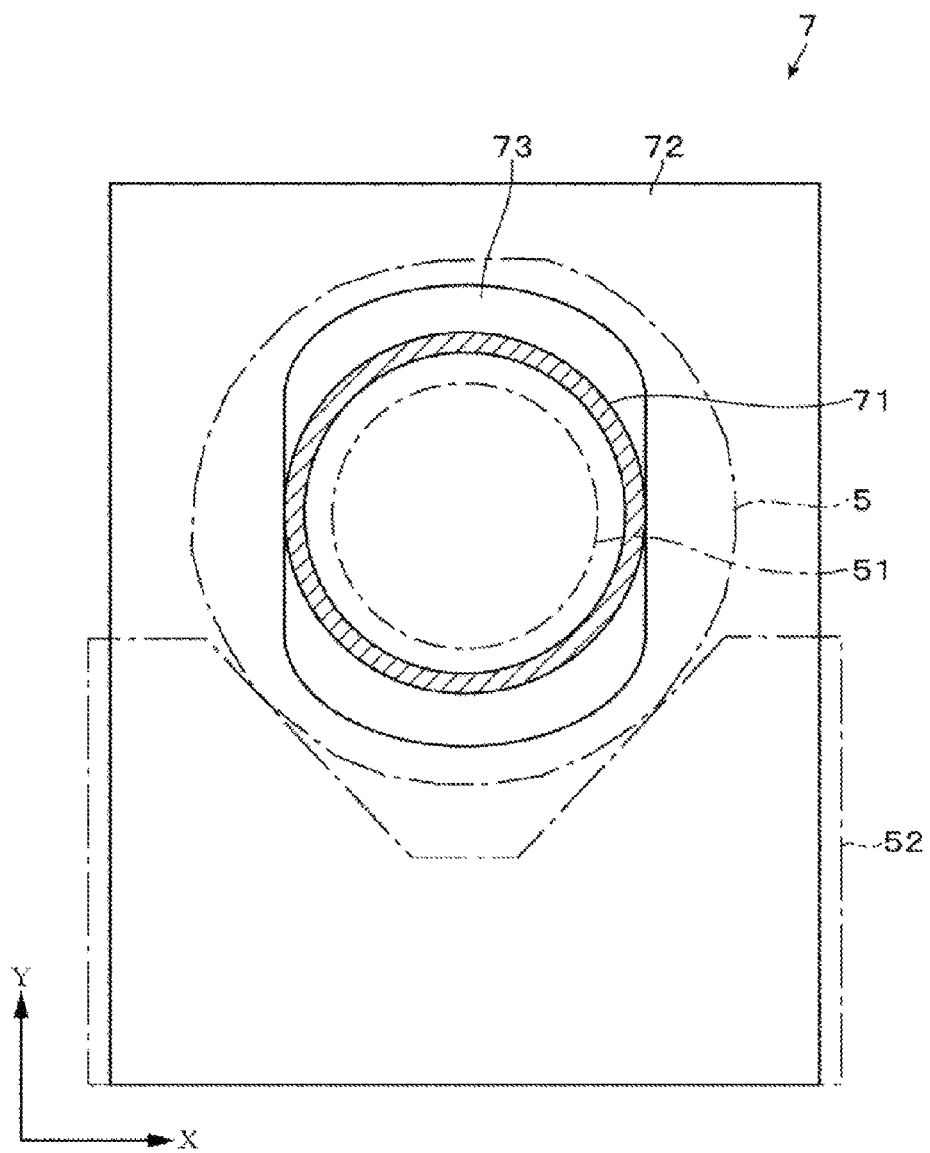
FIG. 8 is a front view showing an example of the regulating part.

As shown in FIGS. 5 and 8, a position of the ring member 5 in the right-left direction is regulated by a regulating part 7 in a state where the ring member 5 is vertically movable and rotatable. Further, in FIG. 5, for the sake of simplicity, the ring member 5, the pedestal part 52, the regulating part 7 and the sleeve 34 are shown to be spaced apart from each other in the anteroposterior direction. The regulating part 7 includes a cylindrical member 71 installed to surround the opening 51 at the rear surface of the ring member 5, a plate-like regulating member 72 and a longitudinal opening 73 formed in the regulating member 72. The regulating member 72 is fixed on, e.g., the ring-like member 61 which constitutes a portion of the bottom of the vacuum container 11. FIG. 8 is a view of the ring member 5 when viewed from the cylindrical member 71. A size of the opening 73 in the right-left direction (X-direction) is set such that the movement of the cylindrical member 71 in the right-left direction is regulated while rotating with the rotation of the ring member 5. In addition, a vertical dimension of the opening 73 is set such that the cylindrical member 71 vertically moves together with the ring member 5, when the support position P of the raw material gas nozzle 31 is adjusted in height.

Since the raw material gas nozzle 31 is loosely fitted into the sleeve 34 through the opening 51 of the ring member 5 and the opening 73 of the regulating member 72, the raw material gas nozzle 31 is supported at the support position P of the lower end of the opening 51 of the ring member 5 as described above. The height level of the support position P is adjusted by rotating the ring member 5 and changing contact positions of the ring member 5 with the pedestal part 52. Such a height adjustment will be described with reference to FIGS. 9 and 10 using a model in which the ring member 5 and the pedestal part 52 are simplified.

Figure 9:
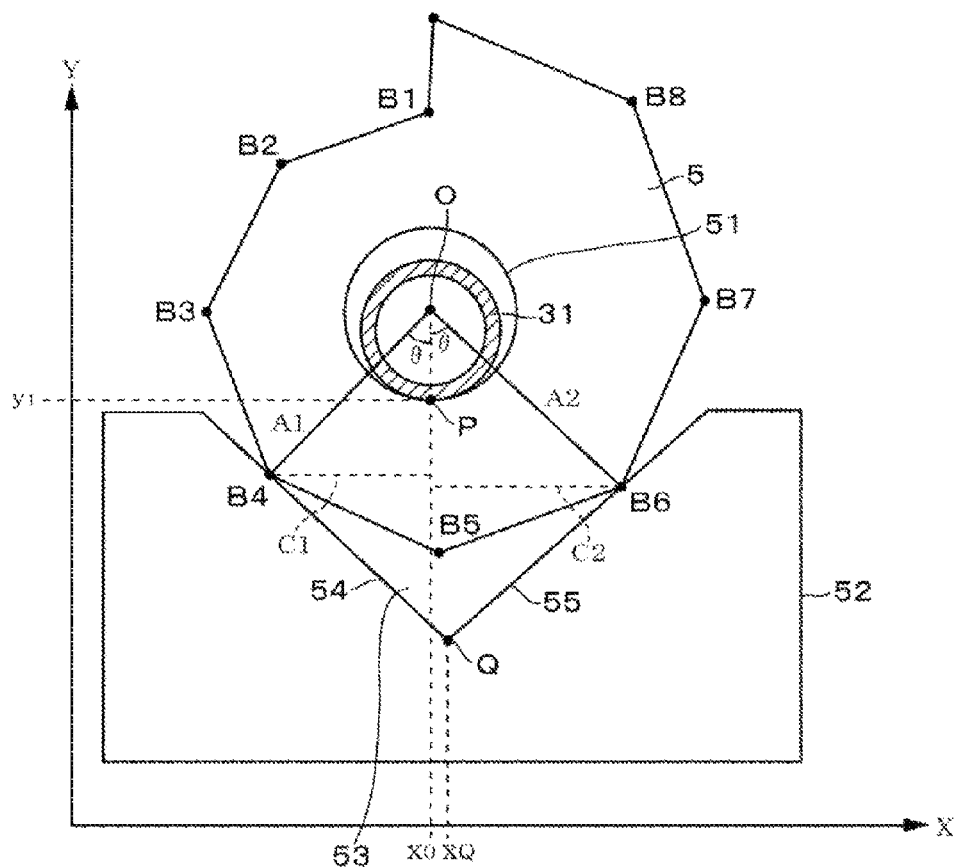
FIG. 9 is a front view showing a ring member and a pedestal part.
Figure 10:
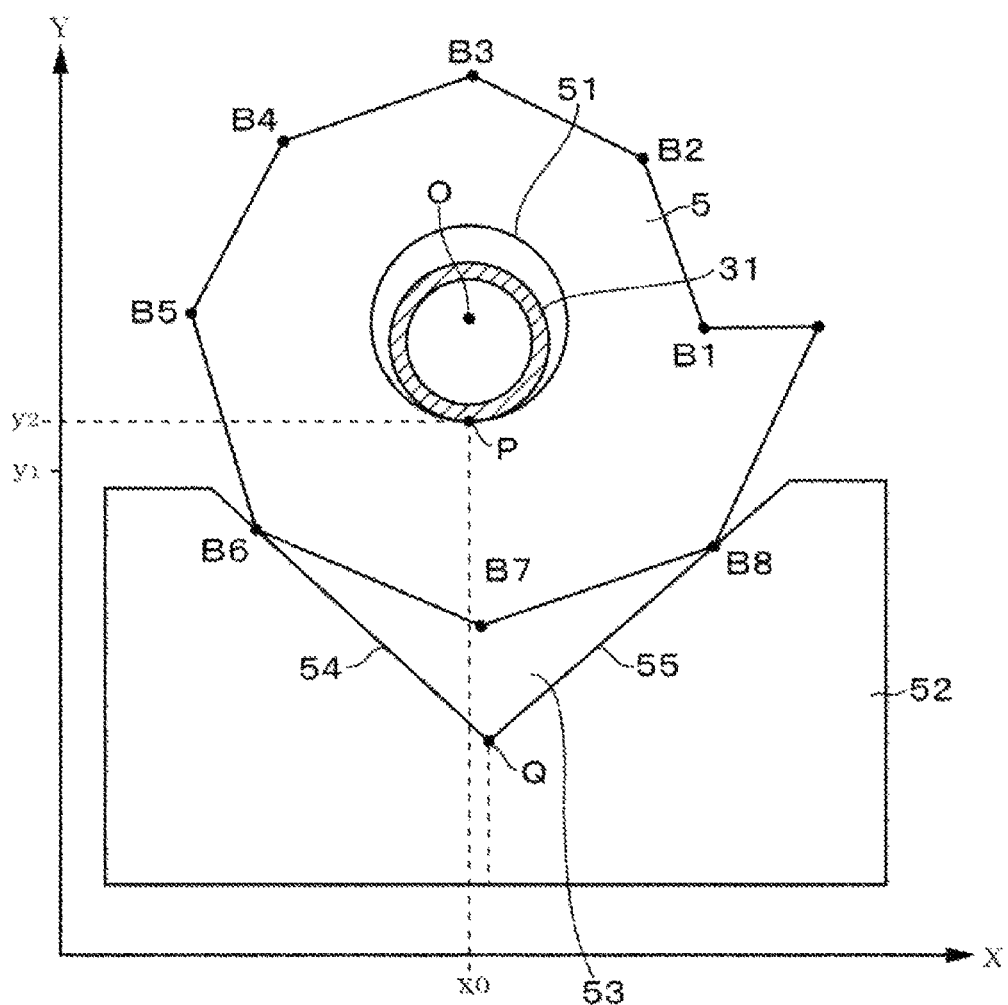
FIG. 10 is a front view showing the ring member and the pedestal part.

As shown in FIGS. 9 and 10, the contour of the outer peripheral surface of the ring member 5 is in the form of, e.g., an octagon in which a difference between a distance from one side to the center point O and a distance from other side adjacent to the one side to the center point O is constant about any sides. In addition, the center point O of the ring member 5 is set to be in line with the center point of the contour of the opening (inner peripheral surface) 51 of the ring member 5. The difference between the radii A1 and A2 becomes constant even if contact positions (a left position B4 and a right position B6 in an example of FIG. 9) of the ring member 5 with the pedestal part 52 are changed. Further, the ring member 5 and the pedestal part 52 are arranged such that the position (X coordinate: xO) of the center point O of the ring member 5 in the right-left direction is displaced from the center position Q (X coordinate: xQ) of the pedestal part 52 in the right-left direction by a predetermined distance.

For example, in the example shown in FIG. 9, the vertex B4 and the vertex B6 of the ring member 5 are brought into contact with the pedestal part 52. A height level of the support position P at this time is defined as y1. Subsequently, the ring member 5 further rotates so that the ring member 5 is brought into contact with pedestal part 52 at vertices B6 and B8, like the example shown in FIG. 10. A height level y2 of the support position P at this time is higher than the height level y1.

The contour of the ring member 5 is configured such that distances (radii) from all vertices B1 to B8 to the center point O are varied. Thus, when the contact positions of the ring member 5 with the pedestal part 52 are changed with the rotation of the ring member 5, distances from the contact positions to the center point O are varied so that the coordinate of the support position P is varied. By using the ring member 5 having the contour as shown in FIG. 7 for example, it is possible to adjust the height level of the support position P within a range from less than 0.1 mm to less than 0.6 mm, as is apparent from an embodiment which will be described later. Since the raw material gas nozzle 31 has an elongated shape, the leading end side of the raw material gas nozzle 31 is drastically fluctuated relative to the base end side thereof. Thus, it is possible to sufficiently adjust an orientation of the raw material gas nozzle 31 in the vertical direction even by the height adjustment in such a range.

Further, in this embodiment, the center point O of the ring member 5 is in line with the center position of the contour of the opening 51, and the difference between the radii in the left and right positions which are the contact positions of the ring member 5 with the pedestal part 52 is set to be constant. Furthermore, the inclined surfaces 54 and 55 constituting the mounting portion 53 of the pedestal part 52 are formed symmetrically with the line 56 passing through the center position Q of the pedestal part 52 in the right-left direction. Thus, the coordinate of the support position P in the X-direction does not vary even if the ring member 5 rotates. In other words, as shown in FIG. 9, assuming that a difference between the radius A1 at the left position B4 and the radius A2 at the right position B6, referred to as α, a difference between a distance C1 from the left position B4 to the support position P in the X-direction and a distance C2 from the right position B6 to the support position P in the X-direction is defined as α sin θ. Since α and θ are constant regardless of the contact positions of the ring member 5, even if the contact positions are changed with the rotation of the ring member 5, the coordinate of the support position P in the X-direction does not vary as xO, as is apparent from an embodiment which will be described later.

As described above, when the inclined surfaces 54 and 55 of the pedestal part 52 are formed symmetrically with the straight line 56 passing through the center position Q of the pedestal part 52 in the X-direction, a position of the center point O of the ring member 5 in the X-direction is set to be decentered with respect to the center position Q of the pedestal part 52 in the X-direction by a set distance. Thus, when rotating the ring member 5, it is possible to adjust the height level of the ring member 5 without changing the position of the support position P in the right-left direction. In addition, in this embodiment, a position of the ring member 5 in the right-left direction is regulated by the regulating part 7. This contributes to surely adjust only the height level of the support position P.

Figure 11:
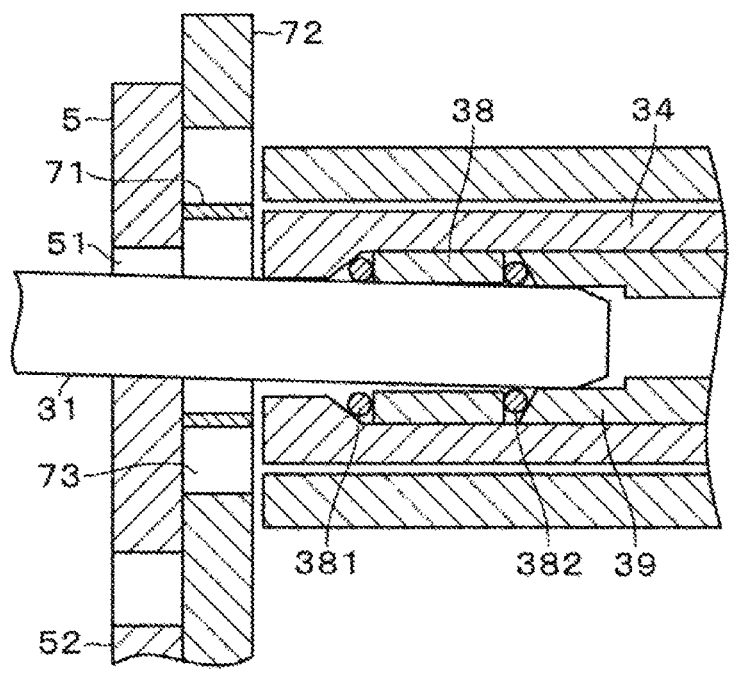
FIG. 11 is a longitudinal side view showing an example in which a support position of a gas nozzle is adjusted.

As described above, the raw material gas nozzle 31 is supported by the ring member 5 inside the vacuum container 11 inward from a point at which the raw material gas nozzle 31 is fixed to the vacuum container 11 by the O-rings 381 and 382. In this configuration, the height level of the support position P is adjusted. In addition, as shown in FIG. 11, when the height adjustment is performed to set the support position P higher than the fixation point, the base end side (support point) of the raw material gas nozzle 31 is lifted up so that the raw material gas nozzle 31 is obliquely supported upward from the horizontal posture within a clearance between the raw material gas nozzle 31 and the sleeve 34. The leading end of the raw material gas nozzle 31 may drop down or be bent by its own weight according to materials of the O-rings 381 and 383 used as an elastic body, a material or length of the raw material gas nozzle 31, or the like. To address this, the height adjustment is performed to raise the height level of the support position P. In this way, the orientation (inclination) of the raw material gas nozzle 31 in the vertical direction is adjusted. With this configuration, the drooping of the leading end of the raw material gas nozzle 31 is suppressed so that the raw material gas nozzle 31 is horizontally arranged in the length direction thereof. That is to say, a gap between the surface of the rotary table 2 and the raw material gas nozzle 31 is uniform over the length direction.

Figure 12:
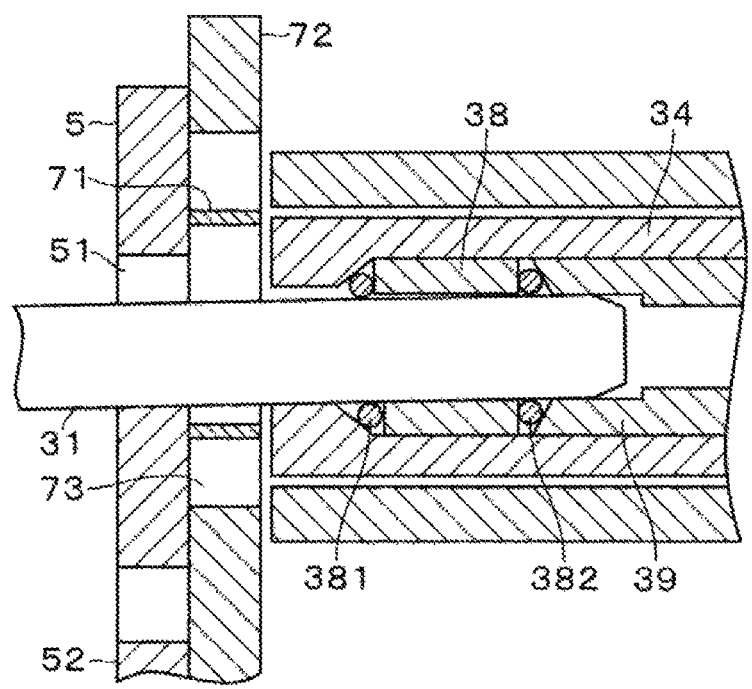
FIG. 12 is a longitudinal side view showing another example in which a support position of a gas nozzle is adjusted.

On the other hand, as shown in FIG. 12, when the height adjustment is performed to set the support position P lower than the fixation point, the base end side (support point) of the raw material gas nozzle 31 is obliquely supported downward from the horizontal posture within the clearance between the sleeve 34 and the raw material gas nozzle 31. As described above, when the leading end of the raw material gas nozzle 31 is bent, the height adjustment is performed to lower the support position P, thus lowering the leading end of the raw material gas nozzle 31. This suppresses the leading end side of the raw material gas nozzle 31 from being bent, thus horizontally holding the raw material gas nozzle 31 over the length direction.

For example, if an amount of the raw material gas supplied from raw material gas nozzle 31 toward the surface of the rotary table 2 is uniform over the length direction of the raw material gas nozzle 31, it is possible to make a concentration of the raw material gas on the wafer in-plane uniform, by horizontally holding the raw material gas nozzle 31. This makes an adsorption amount of the raw material gas on the wafer in-plane uniform, thus contributing to a film forming process having high in-plane uniformity.

In addition, even if the inclination of the raw material gas nozzle 31 was adjusted, since the O-rings 381 and 382 are installed around the inner sleeve 38, at least one of the O-rings 381 and 382 acts as a sealing member, thus maintaining airtightness in the vacuum container 11.

In this way, according to the present disclosure, by rotating the ring member 5 to change the contact positions of the ring member 5 with the pedestal part 52, it is possible to adjust the leading end side of the raw material gas nozzle 31 higher or lower than the base end side thereof, thus adjusting the inclination of the raw material gas nozzle 31. Thus, an initial position (initial point) when the ring member 5 is mounted on the pedestal part 52 is set to the middle position between a mounting position at which an decentering amount is minimum and a mounting position at which the decentering amount is maximum. Further, by rotating the ring member 5 in a direction in which the decentering amount is increased relative to that of the initial position, or in a direction in which the decentering amount is decreased relative to that of the initial position, the inclination of the raw material gas nozzle 31 is adjusted. In some embodiments, the shape of the ring member 5 may be appropriately set depending on a configuration of the apparatus or a process type. Further, in some embodiments, the initial position of the ring member 5 may be set to the mounting position at which the decentering amount is minimum or the mounting position at which the decentering amount is maximum.

In such a configuration, the installation location of the flange 36 of the sleeve 34 is adjusted so that the inclination of the sleeve 34 is roughly adjusted. Further, the ring member 5 is rotated to adjust the height level of the support position P of the raw material gas nozzle 31. In this way, the orientation of the raw material gas nozzle 31 in the vertical direction is adjusted such that, for example, a distance between the raw material gas nozzle 31 and the surface of the rotary table 2 is substantially constant over the length direction of the raw material gas nozzle 31. While in this embodiment, the installation structure of the raw material gas nozzle 31 has been described as an example, the reaction gas nozzle 32, the separation gas nozzles 41 and 42 may also be installed in the vacuum container 11 like the installation structure of the raw material gas nozzle 31, and a height level of the support position thereof may also be adjusted in the same way. Reference numerals 32a, 41a and 42a in FIGS. 1 to 3 represent gas supply tubes, respectively.

The film forming apparatus 1 is provided with a control part 100 including a computer for controlling the operation of the film forming apparatus 1 as a whole. A program to be used in performing a film forming process (which will be described later) is stored in the control part 100. The program is provided to send control signals to respective parts of the film forming apparatus 1 and control operations of the respective parts, and incorporates steps for executing respective processes described below. The program is installed into the control part 100 from a memory medium such a hard disk, a compact disk, a magneto-optical disk, a memory card, a flexible discharge number counter k or the like.

Next, a procedure of the film forming process performed in the aforementioned film forming apparatus 1 will be briefly described. First, the rotary table 2 is intermittently rotated so that the wafer W having a diameter of, e.g., 300 mm, is mounted in the respective recess portion 23. Subsequently, the vacuum container 11 is vacuum-evacuated by the vacuum pump 65 and the wafer W is heated. The raw material gas and the reaction gas are discharged from the raw material gas nozzle 31 and the reaction gas nozzle 32, respectively. In addition, the separation gas is discharged from each of the separation gas nozzles 41 and 42 and the central region C, and the purge gas is discharged from each of the purge gas supply tube 28 and the purge gas supply part 29. Subsequently, an internal pressure of the vacuum container 11 is adjusted to a previously set processing pressure and the film forming process is initiated. The wafer W alternately passes through the first processing region P1 and the second processing region P2 so that the 3DMAS gas adsorbs onto the wafer W. Subsequently, the $O_3$ gas adsorbs onto the wafer W so that 3DMAS molecules are oxidized, thus forming one or more silicon oxide molecular layers. In this way, the silicon oxide molecular layers are sequentially stacked so that a silicon nitride film having a predetermined thickness is formed.

According to the above embodiments, in order to adjust the heights of the support positions of the raw material gas nozzle 31, the reaction gas nozzle 32 and the separation gas nozzles 41 and 42, and to adjust the orientations of the respective gas nozzles in the vertical direction, the raw material gas nozzle 31 and the like pass through the ring member 5, and is mounted on the opening 51 defined by the inner peripheral surface of the ring member 5. The contour of the outer peripheral surface of the ring member 5 is set to the polygon obtained by linearly approximating a spiral curve. The ring member 5 is mounted on the pedestal part 52 at the left position and the right position which are spaced apart from each other in the circumference direction of the ring member 5. The rotation of the ring member 5 changes the left position and the right position at which the ring member 5 is brought into contact with the pedestal part 52. This changes a distance between the left and right positions and the support position P of the ring member 5 at which the raw material gas nozzle 31 is supported, thus adjusting the height of the support position P of the raw material gas nozzle 31. By adjusting the height of the support position P in this way, it is possible to adjust the orientation of the raw material gas nozzle 31 or the like in the vertical direction.

Further, it is possible to freely set a change in the height level of the support position P according to the contour of the outer peripheral surface of the ring member 5, thus simply and surely changing the height level with good precision on the unit of, e.g., 0.1 mm.

Furthermore, since both the ring member 5 and the pedestal part 52 have a simple structure, they can be formed by high corrosion-resistance ceramic. In some embodiments, the ring member 5 and the pedestal part 52 may be formed by metal, and surfaces of the ring member 5 and the pedestal part 52 may be coated with a film. Even in such a case, there is no need to fix the ring member 5 to the pedestal part 52 with strong force. This makes it difficult to peel off the film. Therefore, the high corrosion-resistance prevents particles from being generated by corrosion.

Furthermore, as described above, only the height level of the support position P is changed with the rotation of the ring member 5. Therefore, the raw material gas nozzle 31 or the like does not move in the right-left direction with the rotation of the ring member 5, thus precisely adjusting the height level of the support position P. Furthermore, the regulating part 7 is installed to regulate the movement of the ring member 5 in the right-left direction, which suppresses the ring member 5 from being displaced on the pedestal part 52 or suppresses the ring member 5 from being dropped from the pedestal part 52. This stably supports the raw material gas nozzle 31.

The present disclosure performs the inclination adjustment of the raw material gas nozzle 31 or the like to increase uniformity of the film forming process. However, a position relationship between the turn table 2 and the raw material gas nozzle 31 or the like in a heightwise direction may be varied depending on an apparatus configuration or a process type. To address this, in addition to setting the raw material gas nozzle 31 in the horizontal posture as described above, a concentration of gas in the diameter direction of the rotary table 2 may be adjusted by adjusting the leading end side of the raw material gas nozzle 31 higher or lower than the base end side, thus increasing uniformity of the film forming process.

For example, the wafer W mounted on the rotary table 2 may have a relatively thick film thickness at the vicinity of a peripheral portion thereof as compared to the vicinity of the central portion thereof, depending on a rotational velocity of the rotary table 2, shapes of the separation regions D1 and D2, a flow rate of the raw material gas or the separation gas. Therefore, when the film thickness in the vicinity of the peripheral portion is thick, the inclination of the raw material gas nozzle 31 is adjusted such that the leading end side of the raw material gas nozzle 31 is lowered relative to the base end side thereof, thus increasing an amount of the raw material gas in the vicinity of the central portion and adjusting the concentration of the raw material gas. On the other hand, when the film thickness in the vicinity of the peripheral portion is thin, the inclination of the raw material gas nozzle 31 is adjusted such that the leading end side of the raw material gas nozzle 31 is raised relative to the base end side thereof, thus increasing an amount of the raw material gas in the vicinity of the peripheral portion and adjusting the concentration of the raw material gas.

According to the present disclosure, as described above, it is possible to easily adjust an orientation (inclination) of a gas nozzle in the vertical direction with high precision. This suppresses the inclination adjustment of the gas nozzle from being varied according to levels of skillfulness of workers, thus contributing to ensure more high uniformity of the film forming process.

Second Embodiment

Next, a second embodiment of the present disclosure will be described with reference to FIG. 13. This second embodiment is different from the first embodiment in that, when the support position P of the raw material gas nozzle 31 in both the right-left direction and the height direction changes with the rotation of the ring member 5, the pedestal part 52 is configured to move in the right-left direction.

The shape of the pedestal part 52 is similar to that of the first embodiment except that the pedestal part 52 is mounted on the ring-like member 61 which is a portion of the bottom of the vacuum container 11, but is not fixed thereto. In addition, the contour of the outer peripheral surface of the ring member 57 is formed in a polygon obtained by linearly approximating a spiral curve. Further, the second embodiment is different from the first embodiment in that the center point O of the ring member 57 is in line with the center point of the contour of the opening 571, but a difference between radii at two contact positions (left and right positions) at which the ring member 5 is brought into contact with the pedestal part 52 is not constant. Other configurations are similar to those of the first embodiment. A ring member 57 is configured to vertically move in a state where a position of the ring member 57 in the right-left direction is regulated by the regulating part 7.

Figure 13:
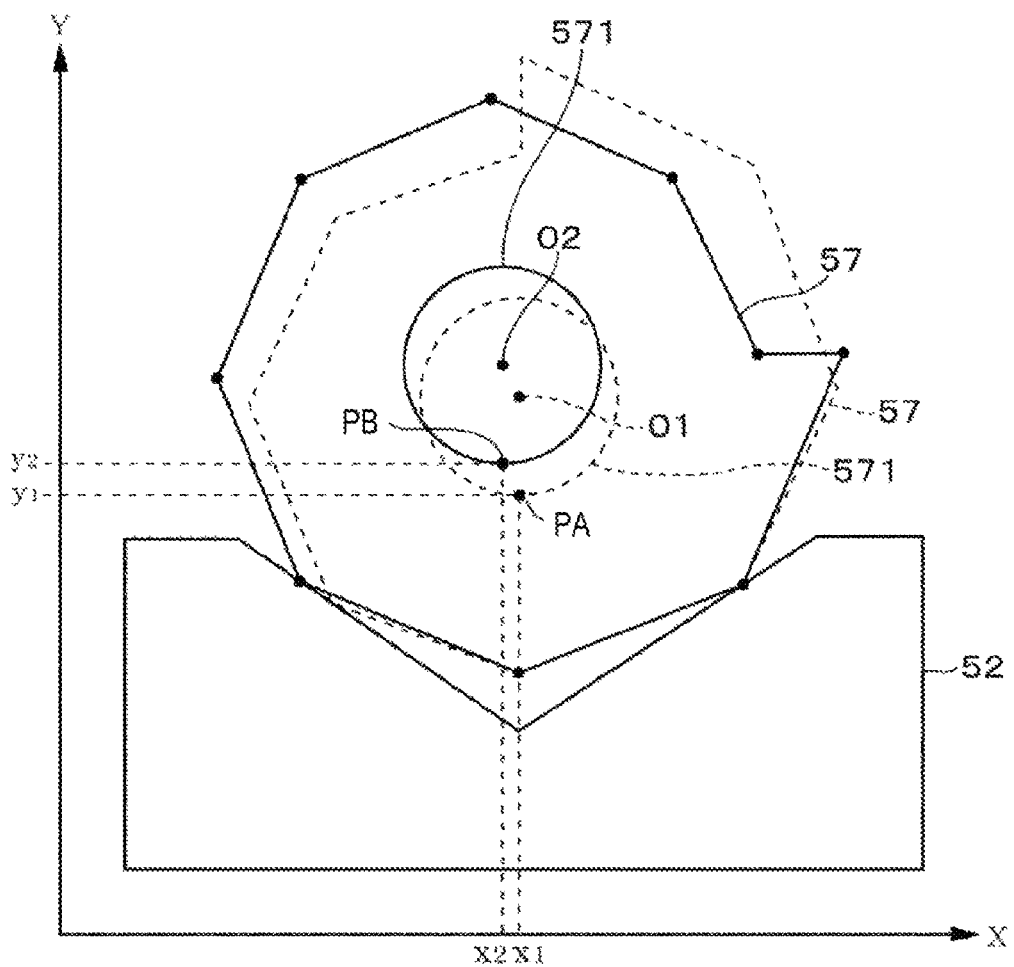
FIG. 13 is a front view showing a ring member according to a second embodiment of the present disclosure.
Figure 14:
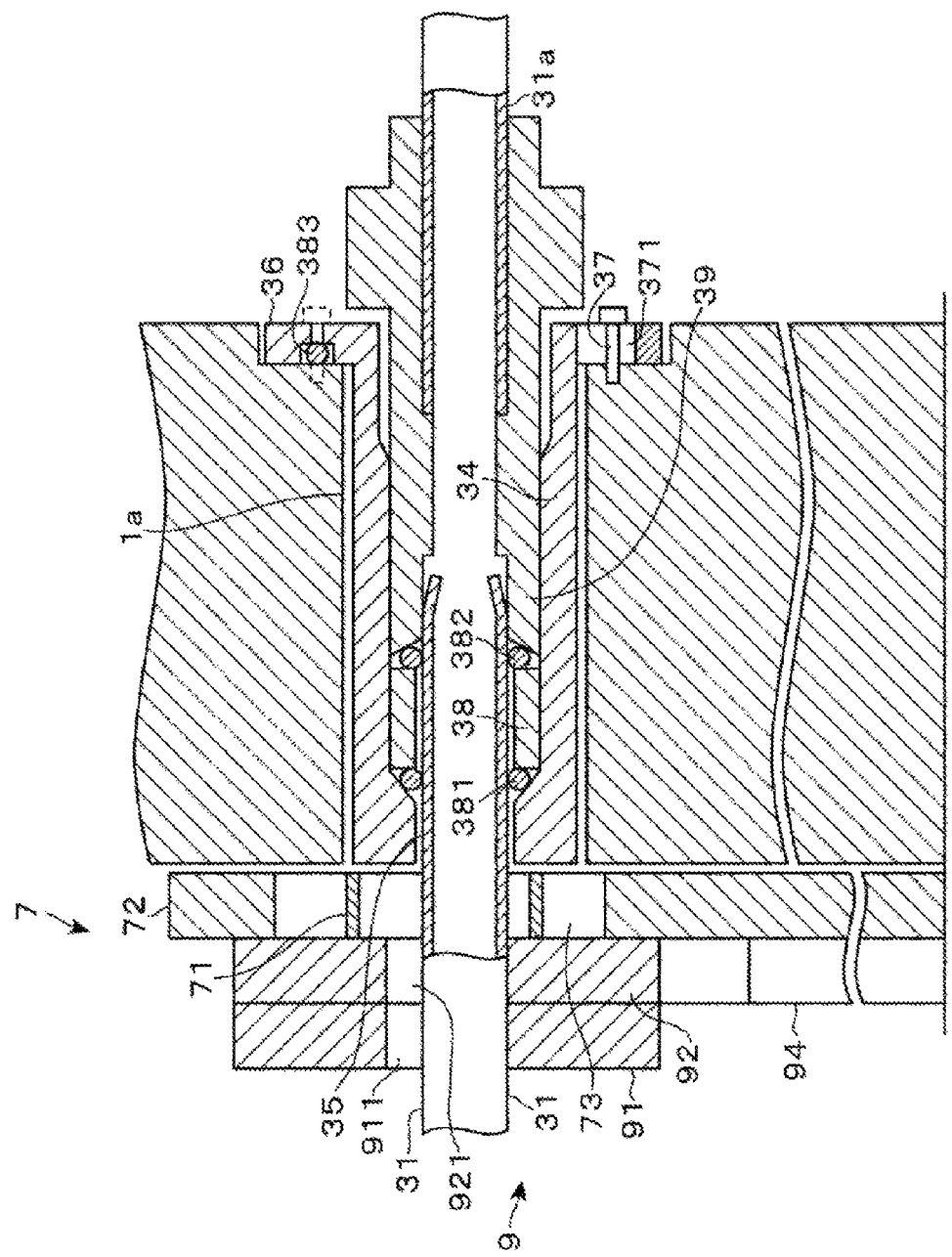
FIG. 14 is a longitudinal side view showing a portion of a film forming apparatus according to a third embodiment of the present disclosure.
Figure 15:
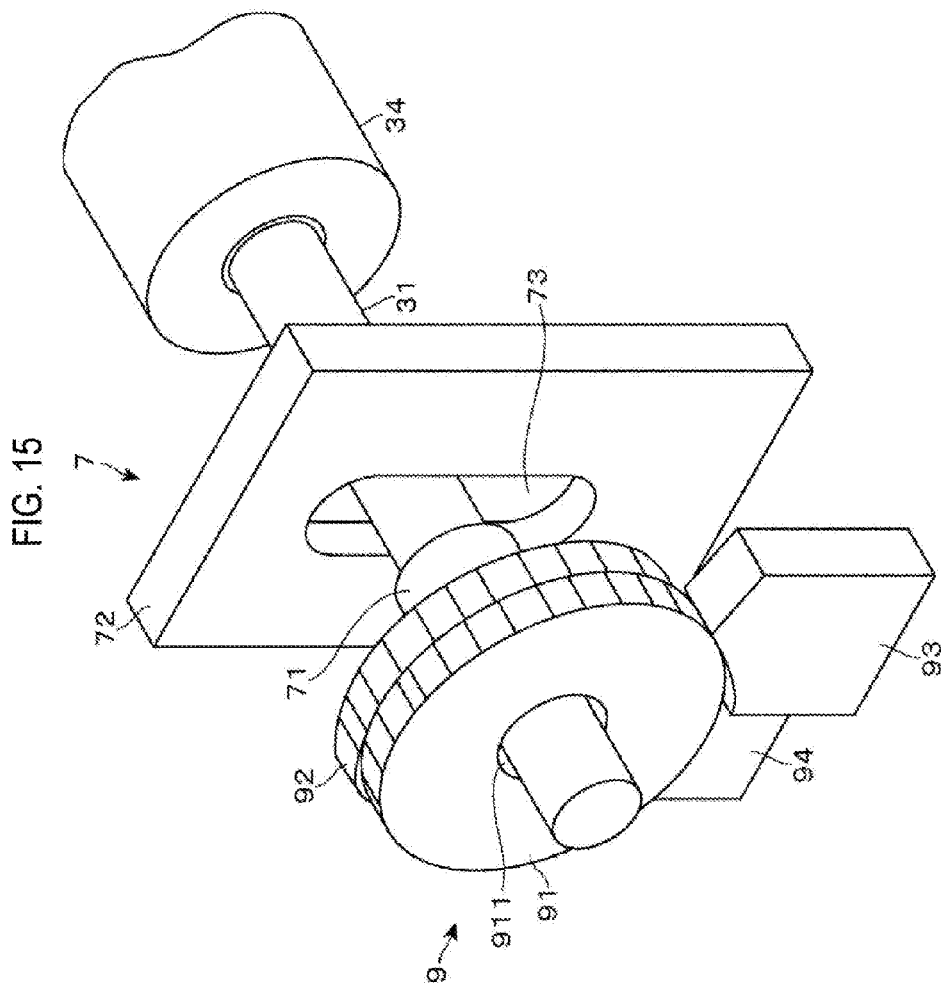
FIG. 15 is a schematic perspective view showing a ring member, a pedestal part and a regulating part, which are installed in the film forming apparatus according to the third embodiment of the present disclosure.

In FIG. 13, a dotted line represents a state before the ring member 57 is rotated and a solid line represents a state after the ring member 57 is rotated. With the rotation of the ring member 57, a support position PA (x1, y1) before the rotation is varied to a support position PB (x2, y2) after the rotation, wherein both vertical and horizontal positions are displaced. In FIG. 13, O1 represents a center point before the rotation, and O2 represents a center point after the rotation.

In this case, the position of the ring member 57 in the right-left direction is regulated by the regulating member 72 through the cylindrical member 71, whereas the pedestal part 52 is not fixed inside the vacuum container 11 and is installed to move in the right-left direction. With this configuration, since the ring member 57, when rotating, cannot move in the right-left direction, the pedestal part 52 automatically moves to follow the rotation of the ring member 57. As a result, when the ring member 57 is rotated, only the height level of the support position P is varied and the position of the support position P in the right-left direction is not varied.

As described above, even in this embodiment, it is possible to surely adjust the height level of the support position P with high precision by simply rotating only the ring member 57, thus adjusting the orientation of each of the gas nozzles 31, 32, 41, and 42 in the vertical direction. In addition, since both the ring member 57 and the pedestal part 52 have a simplified structure, they can be formed by a high corrosion-resistance ceramic, thus suppressing particles from being generated by corrosion. In some embodiments, the ring member 57 may be configured such that the center point of the ring member 57 is not in line with the center point of the contour of the opening 571 and a difference between radii at two contact positions (left and right positions) at which the ring member 57 is brought into contact with the pedestal part 52 is constant.

Third Embodiment

Next, a third embodiment of the present disclosure will be described with reference to FIGS. 14 to 17. This embodiment is different from the first embodiment in that a first ring member 91 and a second ring member 92 which are connected to each other are prepared as the ring member 9, and separated pedestal parts 93 and 94 are prepared to support the first ring member 91 and the second ring member 92, respectively. The first ring member 91 and the second ring member 92 have the same shape. The first ring member 91 and the second ring member 92 are configured to be integrally rotated in a state where they are separated from each other in the anteroposterior direction. Further, the first ring member 91 and the second ring member 92 are configured such that contours of openings 911 and 921 defined by respective inner peripheral surfaces are arranged when viewed in the anteroposterior direction.

For example, the contour of each of the first ring member 91 and the second ring member 92 is set to a polygon obtained by linearly approximating a spiral curve. Further for example, the contour of each of the first ring member 91 and the second ring member 92 is configured such that a difference between a distance from one side to the center point O and a distance from the other side adjacent to the one side to the center point O is constant. In addition, each of the openings 911 and 921 of the first and second ring members 91 and 92 is formed in, e.g., a true circle. The center point O of each of the first and second ring members 91 and 92 is in line with the center point of the contour of each of the openings 911 and 921. Since the raw material gas nozzle 31 is supported at lower ends of the openings 911 and 921, each of the lower ends corresponds to the support position P of the raw material gas nozzle 31.

In addition, the first ring member 91 is supported by, e.g., a right pedestal part 93 in the vicinity of a right side thereof, and the second ring member 92 is supported by, e.g., a left pedestal part 94 in the vicinity of a left side thereof. The right pedestal part 93 and the left pedestal part 94 are respectively fixed on the surface of the ring-like material 61 constituting a portion of the bottom of the vacuum container 11. The right pedestal part 93 and the left pedestal part 94 respectively includes inclined surfaces 931 and 934 in which the right pedestal part 93 and the left pedestal part 94 are brought into contact with the first ring member 91 and the second ring member 92, respectively.

Figure 16:
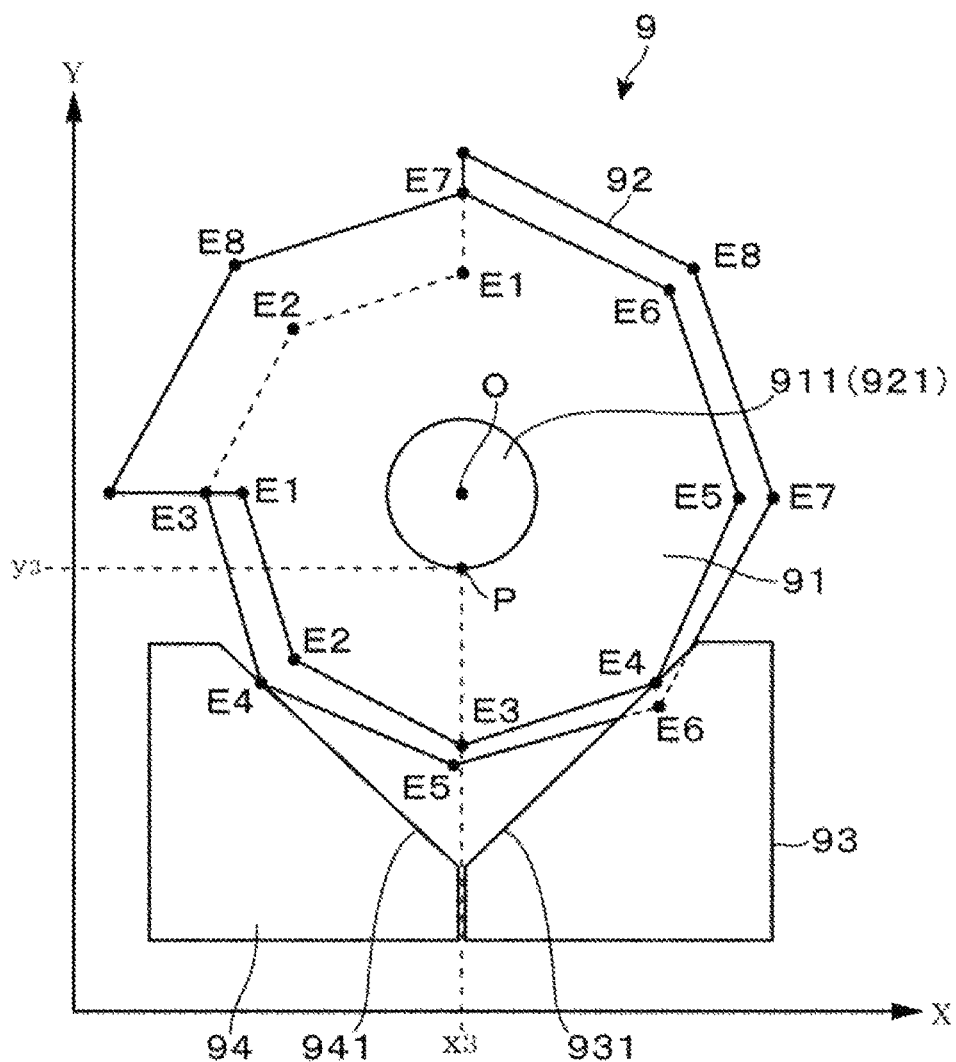
FIG. 16 is a front view showing a ring member and a pedestal part.
Figure 17:
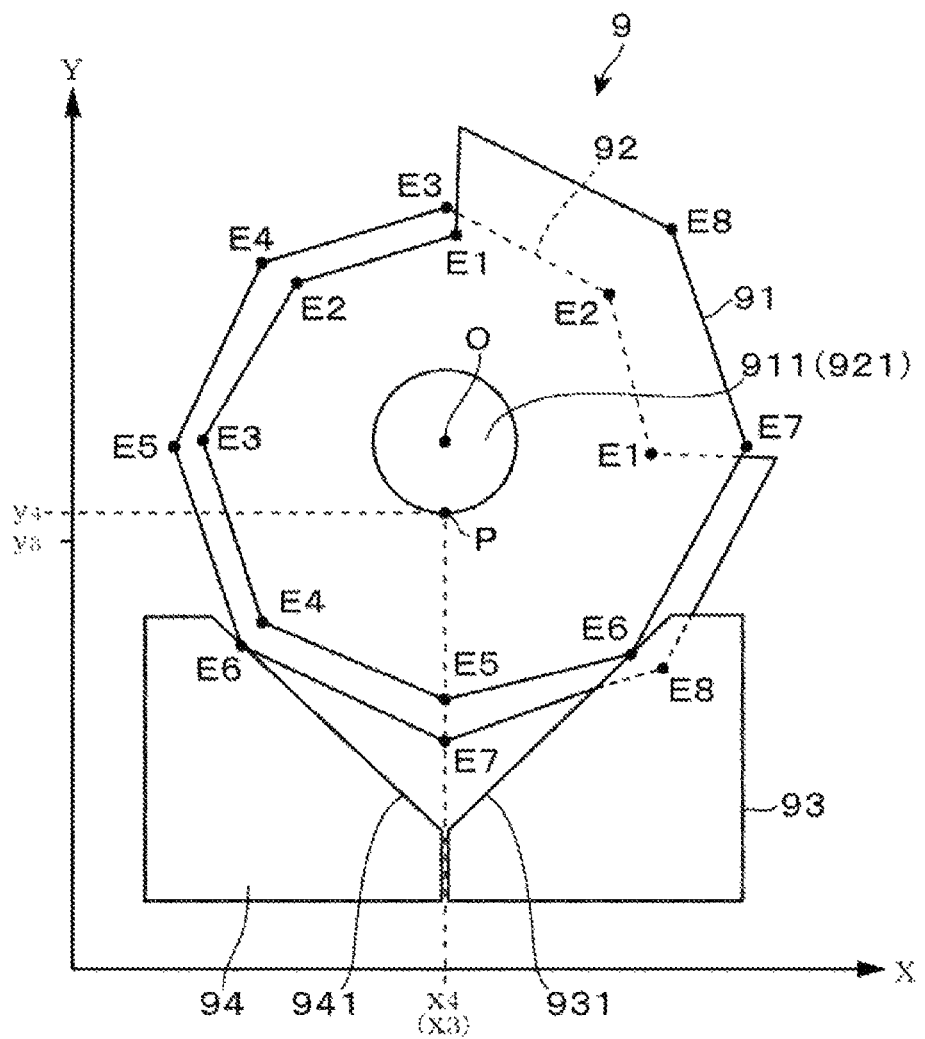
FIG. 17 is a front view showing a ring member and a pedestal part.

FIGS. 16 and 17 briefly show the ring member 9 for the sake of simplicity, respectively. The center points O of the first and second ring members 91 and 92 are in line with each other, and positions (X coordinate) of the support position P and the center point O in the right-left direction coincide with each other. Shapes of the inclined surfaces 931 and 941 of the right and left pedestal parts 93 and 94 are formed symmetrically with a line connecting the support position P with the center point O.

In addition, a rotation position of the second ring member 92 with respect to the first ring member 91 is set such that, when the first ring member 91 and the second ring member 92 are rotated, a mounting position of the first ring member 91 and a mounting position of the second ring member 92 correspond to each other. In other words, the first and second ring members 91 and 92 are formed such that, when they are rotated, a first distance between the right position at which the first ring member 91 is brought into contact with the right pedestal part 93 and the center point O and a second distance between the left position at which the second ring member 92 is brought into contact with the left pedestal part 94 and the center point O is constant.

Other configurations of the third embodiment are similar to those of the first embodiment and like elements are represented by like reference numerals. Therefore, the cylindrical member 71 is installed in the rear surface of the ring member 9, i.e., the second ring member 92, and the regulating member 72 is fixed on the upper surface of the ring-like member 61 constituting the bottom of the vacuum container 11. Thus, the first and second ring members 91 and 92 are configured to vertically move while the movement of the first and second ring members 91 and 92 in the right-left direction is regulated by the regulating part 7.

In examples shown in FIGS. 16 and 17, the first and second ring members 91 and 92 are respectively formed in an octagonal spiral shape and are respectively supported by the right pedestal part 93 and the left side pedestal part 94 at, e.g., respective vertices. In FIG. 16, the first ring member 91 is brought into contact with the right pedestal part 93 at a vertex E4 thereof, and the second ring member 92 is brought into contact with the left pedestal part 94 at a vertex E4 thereof. A coordinate of the support position P at this time is defined as (x3, y3). And, as shown in FIG. 17, once the ring member 9 is rotated, the first ring member 91 is brought into contact with the right pedestal part 93 at a vertex E6 thereof, and the second ring member 92 is brought into contact with the left pedestal part 94 at a vertex E6 thereof. A coordinate of the support position P at this time is defined as (x4, y4). In this case, x3 and x4 are constant as shown in FIG. 17.

As shown in FIGS. 16 and 17, even if the first and second ring members 91 and 92 are rotated, since the first distance from the right position at which the first ring member 91 is brought into contact with the right pedestal part 93 to the center point O and the second distance from the left position at which the second ring member 92 is brought into contact with the left pedestal part 94 to the center point O are constant, it is possible to adjust only the height level without varying the coordinate of the support position P in the right-left direction.

Therefore, according to this embodiment, it is possible to surely adjust the height level of the support position P with high precision by simply rotating the ring member 57 without varying the coordinate of the support position P in the right-left direction, thus adjusting the orientation of each of the gas nozzles 31, 32, 41, and 42 in the vertical direction. Further, since the first and second ring members 91 and 92, the right pedestal part 93 and the left pedestal part 94 have a simplified structure, they can be formed by a high corrosion-resistance ceramic, thus suppressing the generation of particles due to corrosion. In some embodiments, the left side of the first ring member 91 may be supported by the left pedestal part 94 and the right side of the second ring member 92 may be supported by the right pedestal part 93.

Figure 18:
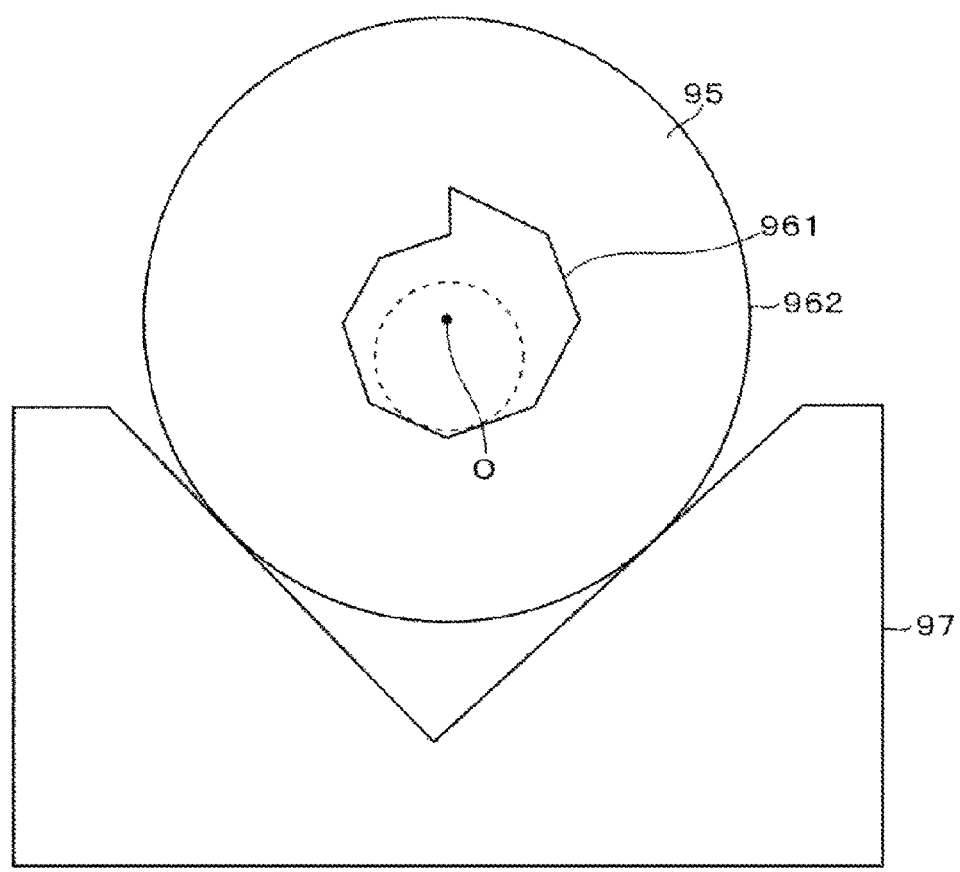
FIG. 18 is a front view showing another example of a ring member.

Further, in some embodiments, as shown in FIG. 18, a ring member 95 which is supported by a pedestal part 97, includes an inner peripheral surface 961 and an outer peripheral surface 962. The inner peripheral surface 961 may be formed in a spiral curve or a polygon obtained by linearly approximating a spiral curve, and the outer peripheral surface 962 may be formed in a true circle or a regular polygon. The symbol O represents the center point of the ring member 95. In some embodiments, the outer peripheral surface 962 of the ring member 95 may be configured by a spiral curve such as an involute curve. Further, the inner peripheral surface 961 of the ring member 95 is not limited to a true circle and may be configured by a regular polygon. Even in such a configuration, a distance between the left and right positions, at which the outer peripheral surface 962 of the ring member 95 is brought into contact with the pedestal part 97, and a support position of the gas nozzle is varied with the rotation of the ring member 95, which makes it possible to adjust a height level of the support position.

In some embodiments, inclined surfaces of the pedestal part 97 may be formed in a line or a curve. Further, the inclined surfaces of the pedestal part 97 are not necessarily formed symmetrically with a line passing through the center position of the pedestal part 97 in the right-left direction. Further, in the first and third embodiments, since the coordinate of the support position in the right-left direction does not change with the rotation of the ring member, the regulating part configured to regulate the movement of the ring member in the right-left direction is not necessarily installed. In some embodiments, instead of installing the regulating part, the through-hole of the sidewall of the vacuum container 11 may be configured in a shape in which the vertical movement of the gas nozzle is permitted but the horizontal movement thereof is regulated.

EXAMPLES

Evaluation Test 1

An evaluation test performed in conjunction with the present disclosure will be described. As an evaluation test 1, a simulation was performed to check a decentering amount of the center point of a ring member in a height direction (Y-direction) and a right-left direction (X-direction) when rotating the ring member. The ring member includes an inner peripheral surface whose contour is a true circle, and an outer peripheral surface whose contour is a polygon obtained by linearly approximating a spiral curve.

A ring member of Example 1 was set to a 32-sided polygon in which an angle between a line connecting one side of the ring member with the center point thereof and a line connecting the other side adjacent to the one side with the center point is set to 11.25 degrees with respect to all sides, and a difference between a distance from one side to the center point and a distance from the other side adjacent to the one side to the center point is set to 0.015 mm with respect to all sides.

A ring member of Example 2 was set to a 16-sided polygon in which an angle between a line connecting one side of the ring member with the center point thereof and a line connecting other side adjacent to the one side with the center point is set to 22.5 degrees with respect to all sides, and a difference between a distance from one side to the center point and a distance from the other side adjacent to the one side to the center point is set to 0.015 mm with respect to all sides.

A ring member of Example 3 was set to a 16-sided polygon like Example 2, but a difference between a distance from one side to the center point and a distance from the other side adjacent to the one side to the center point was set to 0.01 mm with respect to all sides. In the ring members of Examples 1 to 3, a difference between distances from left and right positions to the center point is constant with respect to all contact positions. Herein, the left and right positions are contact positions at which the respective ring member is brought into contact with a pedestal part.

Figure 19:
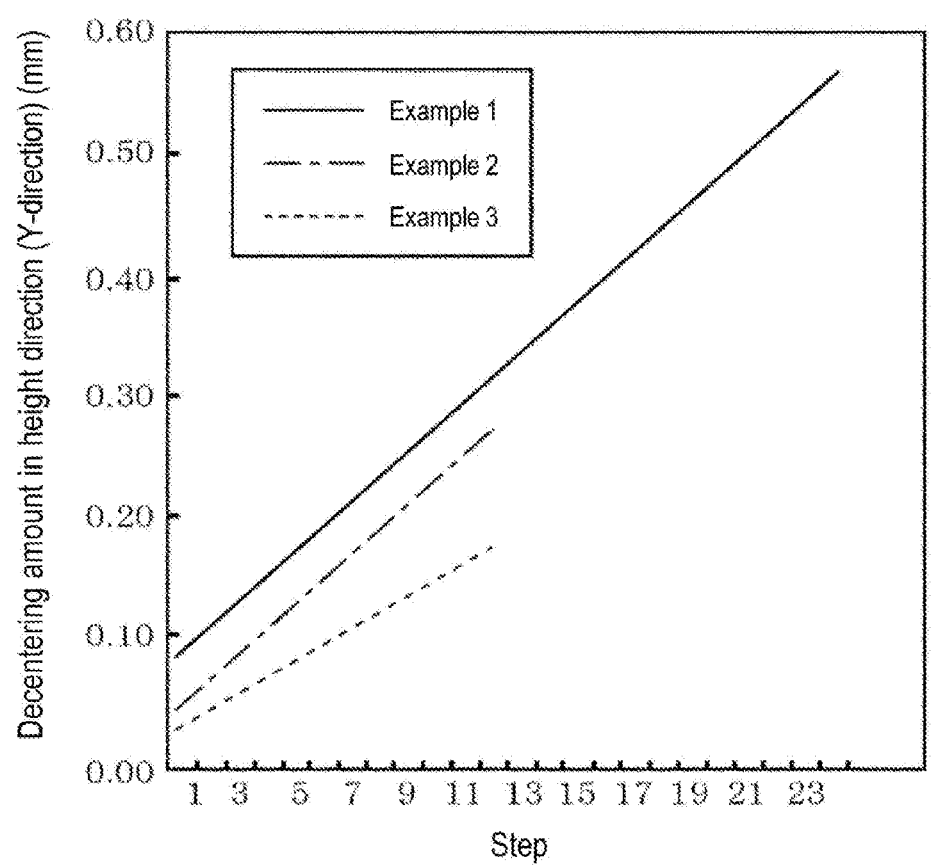
FIG. 19 is a characteristic view showing the result of an evaluation test.
Figure 20:
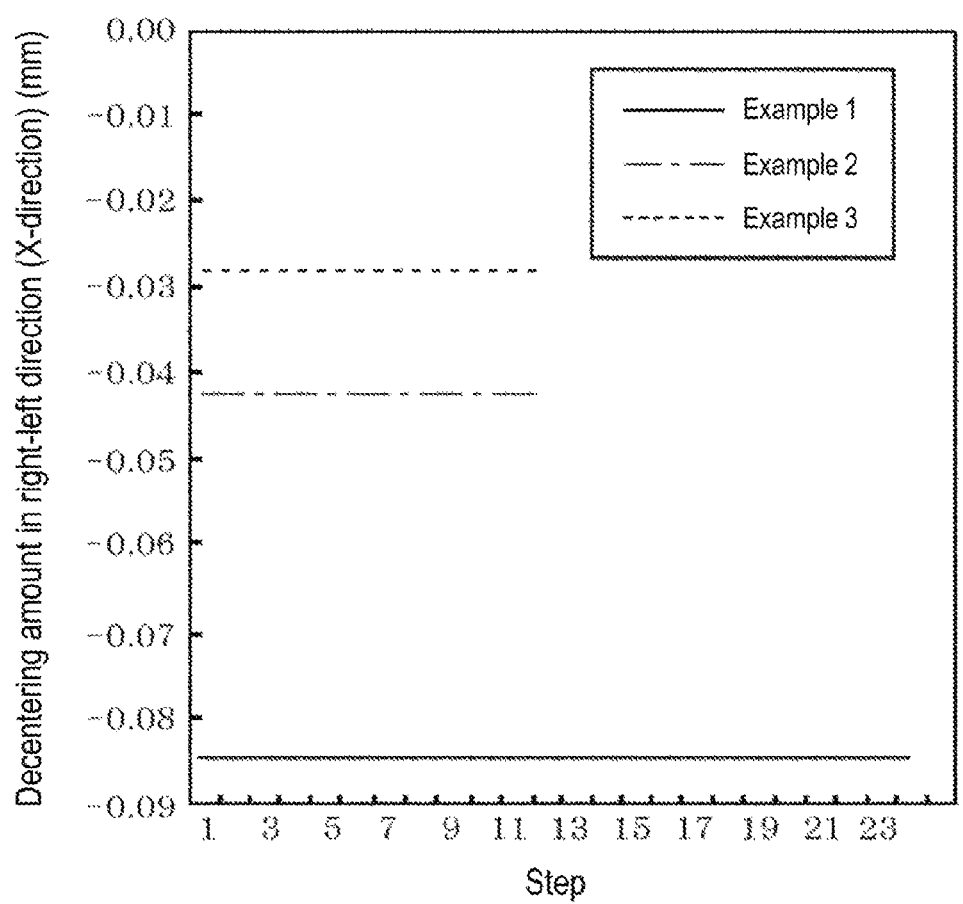
FIG. 20 is a characteristic view showing the result of an evaluation test.

As a result of evaluation test 1, a decentering amount in the height direction (Y-direction) and a decentering amount in the right-left direction (X-direction) are shown in FIGS. 19 and 20, respectively. In each of FIGS. 19 and 20, a vertical axis represents the decentering amount, and a horizontal axis represents a step. The term "step" used herein means a side of polygon in which contact position at which the ring member is brought into contact with the pedestal part exists. Here, step 1 indicates a side at which a distance from the contact position to the center point is shortest. A level of the step is increased with an increase in the distance. Since the number of the contact positions at which the ring member is brought into contact with the pedestal part is two as left and right positions, data of step having a small level is listed. For example, in a ring member of the 16-sided polygon, the ring member is brought into contact with the pedestal part at two positions, i.e., step 7 and step 11. At this time, an decentering amount of the center point corresponds to the data of step 7.

In FIGS. 19 and 20, a solid line indicates the results of Example 1, a dashed dotted line the results of Example 2, and a dashed line the results of Example 3. As shown in FIG. 19, all Examples 1 to 3 show that contact positions at which the ring member is brought into contact with the pedestal part are varied with the rotation of the ring member so that the decentering amount of each of the center points in the height direction is changed. Here, the decentering amount of zero means a height level of a leading end of a gas nozzle when the gas nozzle is kept in a horizontal posture by measuring a levelness of the gas nozzle using a gap gauge. Based on this height level, differences between the center points are listed as the decentering amount. In other words, these examples were provided based on the assumption that a leading end of the gas nozzle dropped down by its own weight is lifted up by adjusting upward a base end side of the gas nozzle, thus horizontally arranging the gas nozzle.

In addition, as shown in FIG. 20, Examples 1 to 3 show that, even if the contact positions at which the ring member is brought into contact with the pedestal part are varied with the rotation of the ring member, the decentering amount in the right-left direction does not change and the center point does not also move in the right-left direction. The reason for this is that, as described in the first embodiment, a difference between respective distances from the left and right positions as the contact positions at which the ring member is brought into contact with the pedestal part, to the center point, is constant about all sides. Thus, it is appreciated that the support position can be displaced along only the height direction while suppressing the displacement of the support position in the right-left direction, by rotating the ring member having the aforementioned shape.

Evaluation Test 2

Evaluation test 2 was performed to actually measure the displacement of a leading end portion of a gas nozzle when rotating the ring member of Example 1. A length of the gas nozzle was set to 461.74 mm and the support position of the ring member was set to a position spaced apart from a base end portion of the ring member by 30.74 mm. And, a difference between height levels of lower ends of the base end portion and the leading end portion was defined as the displacement.

The results are shown in FIG. 21. In FIG. 21, a vertical axis represents the displacement and a horizontal axis represents a step. The term "step" used herein is similar to that defined in FIG. 20. In FIG. 21, a solid line indicates an actual measurement value of the displacement, and a dotted line indicates an estimated value. A negative displacement represents that the leading end portion is positioned lower than the base end portion, and a positive displacement represents that the leading end portion is positioned higher than the base end portion.

The results of Evaluation test 2 show that the contact positions at which the ring member is brought into contact with the pedestal part are varied with the rotation of the ring member, so that the leading end portion of the gas nozzle is positioned lower or higher than the base end portion thereof, thus displacing the height level of the leading end portion to meet the estimated value. Therefore, it is appreciated that, by simply rotating the ring member and varying the contact positions at which the ring member is brought into contact with the pedestal part, it is possible to adjust an orientation of the gas nozzle in the vertical direction with high precision.

According to the present disclosure in some embodiments, in adjusting the height of a support position of a gas nozzle inserted into a through-hole formed in a sidewall of a processing container and adjusting an orientation of the gas nozzle in a vertical direction, the gas nozzle penetrates through a ring member so that the gas nozzle is mounted on an inner peripheral surface of the ring member. The ring member is configured such that at least one of the contours of the outer and inner peripheral surfaces is set to a polygon obtained by linearly approximating a spiral curve. The ring member is mounted on a pedestal part at left and right positions which are spaced apart from each other in a circumference direction of the ring member. The left and right positions at which the ring member is brought into contact with the pedestal part are varied with the rotation of the ring member. This changes distances between the left and right positions and the support position on the inner peripheral surface of the ring member on which the gas nozzle is mounted. Thus, it is possible to adjust the height of the support position of the gas nozzle.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus which supplies a processing gas onto a surface of a substrate mounted on a substrate mounting table from a gas nozzle, the gas nozzle being inserted into a through-hole formed in a sidewall of a processing container and configured to extend in an anteroposterior direction, and the substrate mounting table being movable relative to the gas nozzle, the apparatus comprising:

a ring member installed in a leading end side of to the gas nozzle rather than the through-hole and including an inner peripheral surface on which the gas nozzle inserted into the through-hole is mounted, wherein at least one of contours of an outer peripheral surface and the inner peripheral surface is set to a spiral curve or a polygon obtained by linearly approximating the spiral curve; and a pedestal part on which the ring member is mounted at left and right positions which are spaced apart from each other in a circumference direction of the ring member, wherein a height of a position at which the gas nozzle is supported by the ring member is adjusted with a rotation of the ring member.

2. The substrate processing apparatus of claim 1, further comprising: a regulating part configured to regulate a position of the ring member in a right-left direction in a state where the ring member is movable in a vertical direction and rotatable.

3. The substrate processing apparatus of claim 1, wherein the contour of the inner peripheral surface of the ring member is a true circle or a regular polygon, and the contour of the outer peripheral surface of the ring member is set to a spiral curve or a polygon obtained by linearly approximating the spiral curve.

4. The substrate processing apparatus of claim 3, wherein the contour of the outer peripheral surface of the ring member is a polygon obtained by linearly approximating a spiral curve, wherein a difference between a distance from one side of the ring member to a center point thereof and a distance from another side adjacent to the one side to the center point is constant about all sides.

5. The substrate processing apparatus of claim 1, wherein the pedestal part is installed to move in the right-left direction.

6. The substrate processing apparatus of claim 4, wherein the center point of the polygon is in line with the center point of the contour of the inner peripheral surface of the ring member.

7. The substrate processing apparatus of claim 3, wherein the ring member includes a first ring member and a second ring member which have the same shape and spaced apart from each other in the anteroposterior direction, wherein the first and second ring members being configured to integrally rotate in a mutually connected relationship, and contours of inner peripheral surfaces of the first and second ring members coincide with each other when viewed in the anteroposterior direction, wherein the pedestal part includes a left pedestal part that supports a left side of one of the first and second ring members, and a right pedestal part that supports a right side of the other of the first and second ring members, wherein a rotation position of the second ring member with respect to the first ring member is set such that, when rotating the first and second ring members, a mounting position of the first ring member corresponds to a mounting position of the second ring member.

\* \* \* \* \*